(12) United States Patent
Hatano et al.

(10) Patent No.: US 9,000,442 B2
(45) Date of Patent: Apr. 7, 2015

(54) LIGHT-EMITTING DEVICE, FLEXIBLE LIGHT-EMITTING DEVICE, ELECTRONIC DEVICE, AND METHOD FOR MANUFACTURING LIGHT-EMITTING DEVICE AND FLEXIBLE-LIGHT EMITTING DEVICE

(75) Inventors: Kaoru Hatano, Atsugi (JP); Takaaki Nagata, Atsugi (JP); Nozomu Sugisawa, Isehara (JP); Tatsuya Okano, Atsugi (JP); Akihiro Chida, Atsugi (JP); Tatsunori Inoue, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 225 days.

(21) Appl. No.: 13/005,766

(22) Filed: Jan. 13, 2011

(65) Prior Publication Data

US 2011/0175101 A1  Jul. 21, 2011

(30) Foreign Application Priority Data

Jan. 20, 2010 (JP) ................................. 2010-010430

(51) Int. Cl.
*H01L 27/14* (2006.01)
*H01L 27/12* (2006.01)

(52) U.S. Cl.
CPC ......... *H01L 27/1266* (2013.01); *H01L 27/1225* (2013.01)

(58) Field of Classification Search
CPC .............. H01L 51/5243; H01L 51/529; H01L 27/1266; H01L 27/1265; H01L 27/1225; H01L 33/64; H01L 33/52; H01L 33/00; H01L 33/16
USPC .......... 257/72, E33.053, E33.001; 438/34, 22
See application file for complete search history.

(56) References Cited

U.S. PATENT DOCUMENTS 5,107,175 A   4/1992  Hirano et al.
5,124,204 A   6/1992  Yamashita et al.
(Continued)

FOREIGN PATENT DOCUMENTS

EP   2136406 A   12/2009
JP   63-056625 A   3/1988
(Continued)

OTHER PUBLICATIONS

Kim et al. "Thin Film Passivation for Longevity of Organic Light-Emitting Devices and Organic Thin-Film Transistor," IDW '03, pp. 387-390, Dec. 3, 2003.

(Continued)

*Primary Examiner* — Vongsavanh Sengdara
(74) *Attorney, Agent, or Firm* — Eric J. Robinson; Robinson Intellectual Property Law Office, P.C.

(57) ABSTRACT

To simply provide a flexible light-emitting device with long lifetime. To provide a flexible light-emitting device with favorable display characteristics, high yield, and high reliability without display unevenness. Provided is a flexible light-emitting device including: a substrate having flexibility and a property of transmitting visible light; an adhesive layer provided over the substrate; a conductive layer having a property of transmitting visible light provided over the adhesive layer; an insulating layer disposed over the conductive layer; a transistor provided over the insulating layer; an interlayer insulating layer covering the transistor, a light-emitting element including a first electrode electrically connected to source or drain electrodes of the transistor and provided over the interlayer insulating layer, a second electrode facing the first electrode, and a layer including an organic compound having a light-emitting property provided between the first and second electrodes; and a sealing layer covering the light-emitting element.

40 Claims, 7 Drawing Sheets

(56) References Cited

U.S. PATENT DOCUMENTS

| | | | |
|---|---|---|---|
| 5,189,405 A | | 2/1993 | Yamashita et al. |
| 5,473,511 A | * | 12/1995 | Reddy et al. ............... 361/719 |
| 5,686,360 A | | 11/1997 | Harvey et al. |
| 5,693,956 A | | 12/1997 | Shi et al. |
| 5,757,126 A | * | 5/1998 | Harvey et al. ............... 313/506 |
| 5,771,562 A | | 6/1998 | Harvey et al. |
| 5,811,177 A | | 9/1998 | Shi et al. |
| 5,952,778 A | | 9/1999 | Haskal et al. |
| 6,146,225 A | | 11/2000 | Sheats et al. |
| 6,150,187 A | | 11/2000 | Zyung et al. |
| 6,198,217 B1 | | 3/2001 | Suzuki et al. |
| 6,198,220 B1 | | 3/2001 | Jones et al. |
| 6,239,470 B1 | | 5/2001 | Yamazaki |
| 6,294,478 B1 | | 9/2001 | Sakaguchi et al. |
| 6,372,608 B1 | | 4/2002 | Shimoda et al. |
| 6,413,645 B1 | | 7/2002 | Graff et al. |
| 6,441,468 B1 | | 8/2002 | Yamazaki |
| 6,492,026 B1 | | 12/2002 | Graff et al. |
| 6,506,664 B1 | | 1/2003 | Beyne et al. |
| 6,521,511 B1 | | 2/2003 | Inoue et al. |
| 6,522,067 B1 | | 2/2003 | Graff et al. |
| 6,977,394 B2 | | 12/2005 | Yamazaki et al. |
| 7,067,392 B2 | | 6/2006 | Yamazaki et al. |
| 7,178,927 B2 | | 2/2007 | Seo |
| 7,190,115 B2 | | 3/2007 | Tsuchiya et al. |
| 7,229,900 B2 | | 6/2007 | Takayama et al. |
| 7,268,487 B2 | | 9/2007 | Yamazaki et al. |
| 7,332,381 B2 | | 2/2008 | Maruyama et al. |
| 7,351,300 B2 | | 4/2008 | Takayama et al. |
| 7,446,336 B2 | | 11/2008 | Yamazaki et al. |
| 7,486,368 B2 | | 2/2009 | Sakakura et al. |
| 7,495,256 B2 | | 2/2009 | Yamazaki et al. |
| 7,532,173 B2 | | 5/2009 | Yamazaki et al. |
| 7,619,258 B2 | | 11/2009 | Tsuchiya et al. |
| 7,648,862 B2 | | 1/2010 | Maruyama et al. |
| 7,825,002 B2 | | 11/2010 | Takayama et al. |
| 8,013,335 B2 | | 9/2011 | Yamazaki et al. |
| 8,134,153 B2 | | 3/2012 | Yamazaki et al. |
| 8,188,474 B2 | | 5/2012 | Hatano et al. |
| 8,338,198 B2 | | 12/2012 | Takayama et al. |
| 8,525,171 B2 | | 9/2013 | Yamazaki et al. |
| 8,674,364 B2 | | 3/2014 | Takayama et al. |
| 2001/0020922 A1 | | 9/2001 | Yamazaki et al. |
| 2001/0055085 A1 | * | 12/2001 | Jinno et al. ............... 349/139 |
| 2002/0012587 A1 | | 1/2002 | Farrar et al. |
| 2002/0125817 A1 | | 9/2002 | Yamazaki et al. |
| 2002/0149320 A1 | * | 10/2002 | Maruyama et al. ........ 315/169.3 |
| 2003/0025118 A1 | * | 2/2003 | Yamazaki et al. ............... 257/79 |
| 2003/0034497 A1 | * | 2/2003 | Yamazaki et al. ............... 257/86 |
| 2004/0105052 A1 | * | 6/2004 | Uekita et al. ............... 349/112 |
| 2005/0046346 A1 | | 3/2005 | Tsuchiya et al. |
| 2005/0054178 A1 | | 3/2005 | Utsunomiya |
| 2005/0127371 A1 | * | 6/2005 | Yamazaki et al. ............... 257/72 |
| 2005/0206796 A1 | * | 9/2005 | Okabe ............... 349/43 |
| 2006/0145603 A1 | | 7/2006 | Taniguchi et al. |
| 2007/0159099 A1 | | 7/2007 | Takahashi et al. |
| 2008/0122052 A1 | * | 5/2008 | Fukui ............... 257/678 |
| 2008/0211402 A1 | * | 9/2008 | DeCook et al. ............... 313/511 |
| 2008/0238302 A1 | * | 10/2008 | Sung et al. ............... 313/504 |
| 2009/0023232 A1 | | 1/2009 | Taniguchi et al. |
| 2009/0035899 A1 | * | 2/2009 | Herman et al. ............... 438/151 |
| 2009/0315026 A1 | | 12/2009 | Jeong et al. |
| 2009/0317968 A1 | | 12/2009 | Nagata |
| 2010/0059757 A1 | * | 3/2010 | Kim et al. ............... 257/72 |
| 2010/0091202 A1 | * | 4/2010 | Ostergard ............... 349/11 |
| 2010/0096633 A1 | | 4/2010 | Hatano et al. |
| 2010/0148179 A1 | | 6/2010 | Maruyama et al. |
| 2010/0258839 A1 | | 10/2010 | Matsue |
| 2011/0001146 A1 | | 1/2011 | Yamazaki et al. |
| 2011/0018416 A1 | | 1/2011 | Sassa |
| 2011/0175102 A1 | | 7/2011 | Hatano |
| 2014/0001626 A1 | | 1/2014 | Yamazaki et al. |
| 2014/0264351 A1 | | 9/2014 | Takayama et al. |

FOREIGN PATENT DOCUMENTS

| | | |
|---|---|---|
| JP | 63-314522 A | 12/1988 |
| JP | 07-272857 A | 10/1995 |
| JP | 10-090705 A | 4/1998 |
| JP | 2002-050469 A | 2/2002 |
| JP | 2003-163338 A | 6/2003 |
| JP | 2003-204049 | 7/2003 |
| JP | 2003-273109 | 9/2003 |
| JP | 2004-140267 A | 5/2004 |
| JP | 2005-079395 A | 3/2005 |
| JP | 2005-085705 A | 3/2005 |
| JP | 2008-010211 | 1/2008 |
| JP | 2010-004000 A | 1/2010 |
| WO | WO-2004/036652 | 4/2004 |
| WO | WO-2008/081593 | 7/2008 |

OTHER PUBLICATIONS

Jin et al., "64.1: 5.6-Inch Flexible Full Color Top Emission AMOLED Display on Stainless Steel Foil," SID Digest '06, vol. 37, pp. 1855-1857, Jun. 6, 2006.

Chwang, "64.2: Full Color 100 dpi AMOLED Displays on Flexible Stainless Steel Substrates," SID Digest '06, vol. 37, pp. 1858-1861 Jun. 6, 2006.

\* cited by examiner

LIGHT-EMITTING DEVICE, FLEXIBLE LIGHT-EMITTING DEVICE, ELECTRONIC DEVICE, AND METHOD FOR MANUFACTURING LIGHT-EMITTING DEVICE AND FLEXIBLE-LIGHT EMITTING DEVICE

BACKGROUND OF THE INVENTION

1. Field of the Invention

The present invention relates to a light-emitting device, a flexible light-emitting device and a method for manufacturing the light-emitting device and the flexible light-emitting device. Further, the present invention relates to an electronic device on which the light-emitting device or the flexible light-emitting device is mounted.

2. Description of the Related Art

In recent years, technological development has been remarkably made in the field of displays. In particular, the needs of the market have stimulated tremendous progress in the technology directed to increase in definition of displays and thinning of displays.

In the next phase of this field, focus is placed on commercialization of a flexible display, and a variety of proposals have been made on manufacturing the flexible display (for example, Patent Document 1). A light-emitting device using a flexible substrate can be highly lightweight compared to the case of using a glass substrate or the like.

However, in commercialization of such a flexible display, the biggest problem is its short lifetime.

The lifetime of the flexible display is short because, for a substrate which should support a light-emitting element and protect the element from moisture, oxygen, or the like of the surroundings, a glass substrate that is not flexible cannot be used, and instead, a plastic substrate which has flexibility but high water permeability and low heat resistance has to be used. Since the heat resistance of the plastic substrate is low, a protective film with high quality which needs a high-temperature process cannot be formed, and moisture entering through the plastic substrate has a great influence on the lifetime of the light-emitting element, furthermore, the light-emitting device. In Non-Patent Document 1, for example, an example in which a light-emitting element is formed over a substrate including polyethersulfone (PES) as a base and is sealed with an aluminum film to form a flexible light-emitting device is introduced; however, its lifetime is about 230 hours and the light-emitting device is miles away from commercialization.

Although a metal thin film such as an aluminum film has both flexibility and low water permeability, it does not transmit visible light therethrough with a normal thickness. Thus, in the light-emitting device, a metal thin film is used for only one of a pair of substrates by which a light-emitting element is sandwiched.

REFERENCE

Patent Document

[Patent Document 1]
Japanese Published Patent Application No. 2003-204049

Non Patent Document

[Non Patent Document 1]
Gi Heon Kim et al., IDW'03, 2003, pp. 387-390

In Non Patent Document 1, the lifetime of the light-emitting device is short, and the reason is probably as follows: although moisture is prevented from entering from an upper portion which is sealed with an aluminum film, moisture cannot be prevented from entering through the PES substrate.

In a flexible light-emitting device, since a plastic substrate which has lower heat resistance than a conventionally-used glass substrate has been used, a dense protective film which is formed at high temperature cannot be used and the lifetime of a light-emitting element or a light-emitting device has been short.

Due to use of an organic resin as a material for an adhesive layer or the like in the manufacture of a flexible light-emitting device, display unevenness could be caused.

SUMMARY OF THE INVENTION

In view of the above, it is an object of one embodiment of the present invention to simply provide a flexible light-emitting device with long lifetime. It is another object of one embodiment of the present invention to provide a flexible light-emitting device with high yield, high reliability, and favorable display characteristics which do not cause display unevenness. It is another object to provide an electronic device using the flexible light-emitting device. It is still another object to provide a simple method for manufacturing a flexible light-emitting device.

In a flexible light-emitting device, an adhesive layer containing an organic resin is easily electrically charged because of ionic impurities included in the organic resin or static electricity in the manufacturing process. An electrically charged organic resin leads to malfunction of transistors because the transistors are very close to the adhesive layer with an insulating layer provided therebetween. Specifically, the threshold voltages of the transistors vary to cause a phenomenon in which the transistor is on at the gate voltage at which the transistor is supposed to be off or a phenomenon in which the transistor is off at the gate voltage at which the transistor is supposed to be on. Thus, display unevenness is caused.

The above problem can be solved with a flexible light-emitting device which is manufactured in the following manner: a protective layer is formed at an appropriate temperature so as to have sufficiently low water permeability over a substrate with high heat resistance such as a glass substrate; necessary components such as a transistor, an electrode of a light-emitting element, or a light-emitting element are formed over the protective layer; these components together with the protective layer are then separated from the substrate; a conductive layer having a property of transmitting visible light is formed on a surface of the protective layer which is exposed by the separation; the formed components are then transferred to a plastic substrate; and finally, a sealing layer is formed.

The above problem can also be solved with a flexible light-emitting device which is manufactured in the following manner: a conductive layer having a property of transmitting visible light is formed over a substrate with high heat resistance such as a glass substrate; a protective layer is formed over the conductive layer at an appropriate temperature so as to have sufficiently low water permeability; and necessary components such as a transistor, an electrode of a light-emitting element, or a light-emitting element are formed over the protective layer; these components including the conductive layer are then transferred to a plastic substrate; and finally, a sealing layer is formed.

That is, one embodiment of the invention disclosed in this specification is a flexible light-emitting device which includes: a substrate having flexibility and a property of transmitting visible light; an adhesive layer provided over the substrate; a conductive layer having a property of transmitting visible light provided over the adhesive layer; an insulating layer disposed over the conductive layer; a transistor provided over the insulating layer; an interlayer insulating layer covering the transistor; a light-emitting element including a first electrode electrically connected to a source electrode or a drain electrode of the transistor and provided over the interlayer insulating layer, a second electrode facing the first electrode, and a layer including an organic compound having a light-emitting property provided between the first electrode and the second electrode; and a sealing layer covering the light-emitting element.

The above problem can also be solved with a flexible light-emitting device which is manufactured in the following manner: a protective layer is formed at an appropriate temperature so as to have sufficiently low water permeability over a substrate with high heat resistance such as a glass substrate; a conductive layer having a property of transmitting visible light is formed over the protective layer; a base insulating layer is formed over the conductive layer; necessary components such as a transistor, an electrode of a light-emitting element, or a light-emitting element are formed over the base insulating layer; these components including the protective layer is then transferred to a plastic substrate; and finally, a sealing layer is formed.

That is, another embodiment of the invention disclosed in this specification is a flexible light-emitting device which includes: a substrate having flexibility and a property of transmitting visible light; an adhesive layer provided over the substrate; an insulating layer disposed over the adhesive layer; a conductive layer having a property of transmitting visible light provided over the insulating layer; a base insulating layer formed over the conductive layer; a transistor provided over the base insulating layer; an interlayer insulating layer covering the transistor; a light-emitting element including a first electrode electrically connected to a source electrode or a drain electrode of the transistor and provided over the interlayer insulating layer, a second electrode facing the first electrode, and a layer including an organic compound having a light-emitting property provided between the first electrode and the second electrode; and a sealing layer covering the light-emitting element.

Another embodiment of the invention disclosed in this specification is a flexible light-emitting device having the above structure which further includes a pixel portion including a light-emitting element and a transistor; and a driver circuit portion including a transistor and being provided outside the pixel portion. The transistor in the pixel portion and the transistor in the driver circuit portion are formed in a same process.

Another embodiment of the invention disclosed in this specification is a flexible light-emitting device having the above structure, in which crystalline silicon is used for an active layer of the transistor. Another embodiment of the invention disclosed in this specification is a flexible light-emitting device having the above structure, in which an oxide semiconductor is used for an active layer of the transistor.

Another embodiment of the invention disclosed in this specification is a flexible light-emitting device having the above structure, in which the sealing layer includes a metal substrate. Here, a material selected from stainless steel, aluminum, copper, nickel, and an aluminum alloy is preferably used as the metal substrate.

Another embodiment of the invention disclosed in this specification is a flexible light-emitting device having the above structure, in which the adhesive layer is formed using at least one material selected from an epoxy resin, an acrylic resin, a silicone resin, and a phenol resin.

Another embodiment of the invention disclosed in this specification is a flexible light-emitting device having the above structure, in which a waterproof layer is formed between the substrate having flexibility and a property of transmitting visible light and the adhesive layer. The waterproof layer is preferably a layer containing silicon and nitrogen or a layer containing aluminum and nitrogen.

Another embodiment of the invention disclosed in this specification is a flexible light-emitting device having the above structure, in which the substrate having flexibility and the property of transmitting visible light includes a surface facing the sealing layer, and includes a surface, which is provided with a coat layer, being opposite to the surface facing the sealing layer.

Another embodiment of the invention disclosed in this specification is a flexible light-emitting device having the above structure, in which the coat layer has a property of transmitting visible light and high hardness. Further, the coat layer is a conductive layer having a property of transmitting visible light.

Another embodiment of the invention disclosed in this specification is a flexible light-emitting device having the above structure, in which the insulating layer includes silicon and nitrogen.

Another embodiment of the invention disclosed in this specification is an electronic device including the flexible light-emitting device having any of the above structures for a display portion.

Another embodiment of the invention disclosed in this specification is a method for manufacturing a flexible light-emitting device, which includes the steps of: forming a separation layer over a formation substrate; forming an insulating layer over the separation layer; forming a plurality of transistors over the insulating layer; forming an interlayer insulating layer over transistors; forming a first electrode electrically connected to a source electrode or a drain electrode of each of the transistors over the interlayer insulating layer; forming a partition wall so as to cover an end portion of the first electrode; bonding a temporary supporting substrate to the first electrode and the partition wall; separating the insulating layer, the transistors, the interlayer insulating layer, the first electrode, the partition wall, and the temporary supporting substrate from the formation substrate, between the separation layer and the insulating layer; forming a conductive layer having a property of transmitting visible light over a surface of the insulating layer which is exposed by the separating step; bonding a substrate having flexibility and a property of transmitting visible light to the conductive layer using an adhesive layer; removing the temporary supporting substrate to expose a surface of the first electrode; forming a layer including an organic compound having a light-emitting property so as to cover the first electrode which is exposed; forming a second electrode so as to cover the layer including an organic compound having a light-emitting property; and forming a sealing layer over the second electrode.

Another embodiment of the invention disclosed in this specification is a method for manufacturing a flexible light-emitting device, which includes the steps of: forming a separation layer over a formation substrate; forming an insulating layer over the separation layer; forming a conductive layer having a property of transmitting visible light over the insulating layer; forming a base insulating layer over the conductive layer; forming a plurality of transistors over the base insulating layer; forming an interlayer insulating layer over the transistors; forming a first electrode electrically connected to a source electrode or a drain electrode of each of the transistors over the interlayer insulating layer; forming a partition wall so as to cover an end portion of the first electrode; bonding a temporary supporting substrate to the first electrode and the partition wall; separating the insulating layer, the conductive layer, the base insulating layer, the transistors, the interlayer insulating layer, the first electrode, the partition wall, and the temporary supporting substrate from the formation substrate, between the separation layer and the insulating layer; bonding a substrate having flexibility and a property of transmitting visible light to a surface of the insulating layer which is exposed by the separating step, using an adhesive layer; removing the temporary supporting substrate to expose a surface of the first electrode; forming a layer including an organic compound having a light-emitting property so as to cover the first electrode which is exposed; forming a second electrode so as to cover the layer including an organic compound having a light-emitting property; and forming a sealing layer over the second electrode.

Another embodiment of the invention disclosed in this specification is a method for manufacturing a flexible light-emitting device, which includes the steps of: forming a separation layer over a formation substrate; forming a conductive layer having a property of transmitting visible light over the separation layer; forming an insulating layer over the conductive layer; forming a plurality of transistors over the insulating layer; forming an interlayer insulating layer over the transistors; forming a first electrode electrically connected to a source electrode or a drain electrode of each of the transistors over the interlayer insulating layer; forming a partition wall so as to cover an end portion of the first electrode; bonding a temporary supporting substrate to the first electrode and the partition wall; separating the insulating layer, the conductive layer, the transistors, the interlayer insulating layer, the first electrode, the partition wall, and the temporary supporting substrate from the formation substrate, between the separation layer and the conductive layer; bonding a substrate having flexibility and a property of transmitting visible light to a surface of the conductive layer which is exposed by the separating step, using an adhesive layer; removing the temporary supporting substrate to expose a surface of the first electrode; forming a layer including an organic compound having a light-emitting property so as to cover the first electrode which is exposed; forming a second electrode so as to cover the layer including an organic compound having a light-emitting property; and forming a sealing layer over the second electrode.

Another embodiment of the invention disclosed in this specification is the above method for manufacturing a flexible light-emitting device, in which the insulating layer is formed by a plasma CVD method at a temperature greater than or equal to 250° C. and less than or equal to 400° C.

One embodiment of the present invention can simply provide a flexible light-emitting device with long lifetime. One embodiment of the present invention can provide a flexible light-emitting device with favorable display characteristics, high yield, and high reliability without display unevenness. One embodiment of the present invention can provide an electronic device including the flexible light-emitting device. One embodiment of the present invention can provide a simple method for manufacturing the flexible light-emitting device.

DETAILED DESCRIPTION OF THE INVENTION

Hereinafter, embodiments of the present invention will be described with reference to the accompanying drawings. However, the present invention can be carried out in many different modes, and it is easily understood by those skilled in the art that modes and details thereof can be modified in various ways without departing from the spirit and the scope of the present invention. Therefore, the present invention should not be interpreted as being limited to the description of the embodiments.

Embodiment 1

In this embodiment, a light-emitting device of one embodiment of the present invention and a method for manufacturing a light-emitting device according to one embodiment of the present invention will be described. First, the light-emitting device of this embodiment will be described with reference to FIGS. 1A to 1C.

Figure 1A:
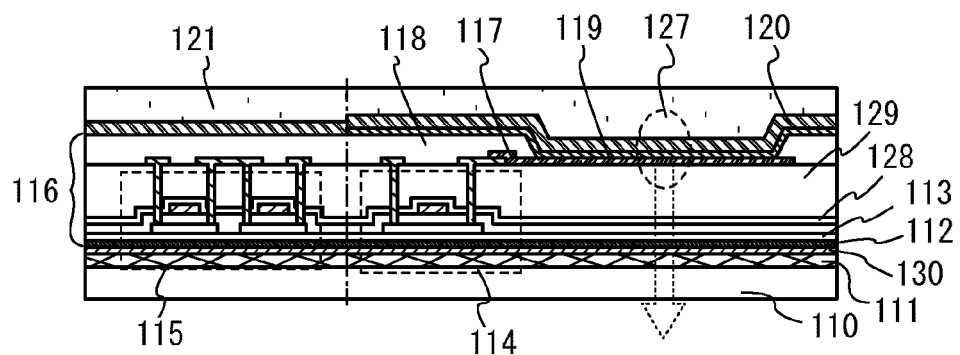
FIGS. 1A to 1C each illustrate a light-emitting device according to one embodiment.
Figure 1B:
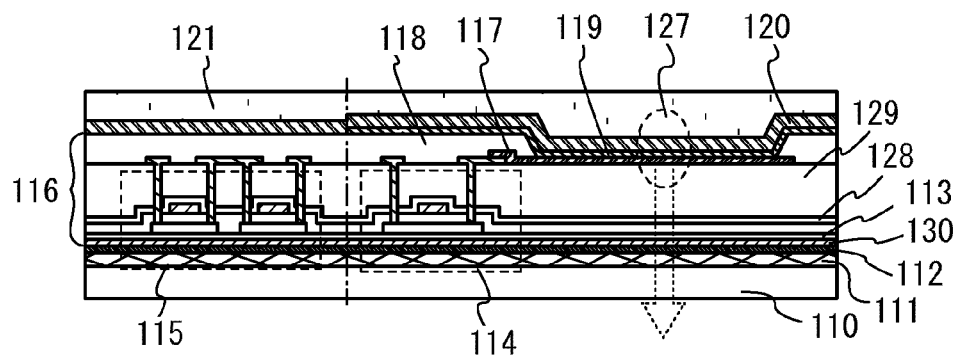

FIGS. 1A and 1B each illustrate an example of a flexible light-emitting device. The flexible light-emitting devices illustrated in FIGS. 1A and 1B each include a plastic substrate 110, a first adhesive layer 111, a heat radiation material layer 130, a protective layer 112, a base insulating layer 113, a transistor 114 for a pixel portion, a transistor 115 for a driver circuit portion, a light-emitting element 127 (including a first electrode 117, a layer 119 containing an organic compound having a light-emitting property (hereinafter referred to as an EL (electroluminescence) layer), and a second electrode 120), a partition wall 118, a first interlayer insulating layer 128, a second interlayer insulating layer 129, and a sealing layer 121.

A difference in structure between the flexible light-emitting devices illustrated in FIGS. 1A and 1B is that in FIG. 1A, a conductive layer 130 having a property of transmitting visible light is bonded to the plastic substrate 110 with use of the first adhesive layer 111, and the protective layer 112 is formed over the conductive layer 130 having a property of transmitting visible light, while in FIG. 1B, the protective layer 112 is bonded to the plastic substrate 110 with the first adhesive layer 111, and the conductive layer 130 having a property of transmitting visible light is formed over the protective layer 112.

In the flexible light-emitting device according to this embodiment, an organic resin is used for the first adhesive layer 111 and thus, electrical charge of the organic resin (electrical charge caused by ionic impurities included in the organic resin or static electricity in the manufacturing process) easily occurs. However, as illustrated in FIGS. 1A and 1B, the flexible light-emitting device according to this embodiment includes the conductive layer 130 having a property of transmitting visible light between the first adhesive layer 111 and a transistor; therefore, malfunction of transistors due to electrical charge of the organic resin can be suppressed, which can prevent display unevenness.

Here, an example of the display unevenness is, for example, a phenomenon in which the contrast ratio is reduced by light emission from some or most of the light-emitting elements which are not supposed to emit light in the case where black is displayed without light emission from the light-emitting elements.

The flexible light-emitting display illustrated in FIG. 1A includes the base insulating layer 113, the transistor 114 for the pixel portion, the transistor 115 for the driver circuit portion, the first electrode 117 of the light-emitting element electrically connected to the transistor 114 for the pixel portion, and the partition wall 118 covering an end portion of the first electrode 117 which are provided over the protective layer 112. FIG. 1A illustrates part of these components. The flexible light-emitting display illustrated in FIG. 1B is provided with the base insulating layer 113, the transistor 114 for the pixel portion, the transistor 115 for the driver circuit portion, the first electrode 117 of the light-emitting element electrically connected to the transistor 114 for the pixel portion, and the partition wall 118 covering an end portion of the first electrode 117 which are provided over the conductive layer 130 having a property of transmitting visible light. FIG. 1B illustrates part of these components.

The light-emitting element 127 includes the first electrode 117 which is exposed from the partition wall 118, the EL layer 119 which includes a light-emitting organic compound and which is formed so as to cover at least the exposed first electrode 117, and the second electrode 120 which is provided so as to cover the EL layer 119. The sealing layer 121 is formed over the second electrode 120. Note that the driver circuit portion is not necessarily provided, and a CPU portion may be provided. In FIGS. 1A and 1B, a layer 116 to be separated includes at least the protective layer 112, the conductive layer 130 having a property of transmitting visible light, the base insulating layer 113, the transistor 114 for the pixel portion, the transistor 115 for the driver circuit portion, the first interlayer insulating layer 128, the second interlayer insulating layer 129, the first electrode 117, and the partition wall 118, but this is just an example which can be easily manufactured and the components included in the layer 116 to be separated are not limited thereto.

The light-emitting device according to this embodiment is manufactured in the following manner: the layer 116 to be separated which includes the protective layer 112 is formed over a formation substrate with high heat resistance such as a glass substrate or a ceramic substrate with the separation layer provided therebetween; the layer 116 to be separated is then separated from the formation substrate along the separation layer; and the layer 116 to be separated which is separated is bonded onto the plastic substrate 110 with an adhesive. Accordingly, the protective layer 112 having sufficiently low water permeability can be provided over the plastic substrate 110 having high water permeability. Therefore, the light-emitting device according to this embodiment includes the first adhesive layer 111 between the plastic substrate 110 and the protective layer 112.

The plastic substrate in this specification means a substrate having flexibility and a property of transmitting visible light. There is no particular limitation on the plastic substrate 110 as long as it has flexibility and a property of transmitting visible light, but it is preferable to use a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, or the like. The plastic substrate is preferably made of a material having a low thermal expansion coefficient. Therefore a polyamide imide resin, a polyimide resin, PET, or the like which has a thermal expansion coefficient of $30\times10^{-6}$ or less can be suitably used. A substrate in which a glass fiber is impregnated with a resin or a substrate whose thermal expansion coefficient is reduced by mixing an organic resin with an inorganic filler can also be used.

In order to improve light extraction efficiency, the refractive index of the plastic substrate is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferred, because such a filler can maintain optical transparency.

Further, a surface of the plastic substrate which faces the air is preferably uneven. The unevenness of the surface of the plastic substrate which faces the air makes it possible to extract the component of light emitted from the light emitting element that is totally reflected and not able to be extracted to the air, and thus the light extraction efficiency can be improved.

Alternatively, the plastic substrate 110 may have a structure in which the above material is combined with an anti-fouling film, an uneven film capable of improving the light extraction efficiency, or the like.

The first adhesive layer 111 includes a material having a property of transmitting visible light. For example, any of a variety of curable adhesives, e.g., a light curable adhesive such as a UV curable adhesive, a reactive curable adhesive, a thermal curable adhesive, and an anaerobic adhesive can be used. As such an adhesive, an epoxy resin, an acrylic resin, a silicone resin, a phenol resin, or the like is used. For the first adhesive layer 111, a material having low moisture permeability is preferably used, and an epoxy resin can be suitably used in particular.

An organic resin is used for the first adhesive layer 111 as described above. However, an organic resin is easily electrically charged because of ionic impurities included in the organic resin or static electricity in the manufacturing process. An electrically charged organic resin leads to malfunction of transistors in some cases because the transistors are very close to the first adhesive layer 111 with an insulating layer provided therebetween. Nevertheless, the flexible light-emitting device according to this embodiment includes the conductive layer 130 having a property of transmitting visible light between the first adhesive layer 111 and a transistor; therefore, malfunction of transistors due to electrical charge of the organic resin can be suppressed, which can prevent display unevenness.

In order to increase the thermal conductance of the first adhesive layer 111, a material in which a thermally conductive filler is dispersed into a resin may be employed. The first adhesive layer 111 formed by dispersing a thermally conductive filler into a resin preferably has a thermal conductivity of 0.50 W/m·K or more, further preferably 1.0 W/m·K or more. As the thermally conductive filler, a material having a higher thermal conductivity than the above resin used for the first adhesive layer is used. In particular, a material having a thermal conductivity of 30 W/m·K or more is preferably used. Examples include aluminum which has a thermal conductivity of 260 W/m·K, aluminum nitride which has a thermal conductivity of 300 W/m·K, alumina which has a thermal conductivity of 36 W/m·K, boron nitride, silicon nitride, and the like. Another example of the thermally conductive filler is a metal particle of silver, copper having a thermal conductivity of 388 W/m·K, or the like. A filler functioning as a drying agent is preferably used as the thermally conductive filler because such a filler improves the moisture resistance of the first adhesive layer 111 in addition to the thermal conductivity. The thermally conductive filler and the filler functioning as a drying agent may be mixed and used. Zeolite is an example of the filler functioning as a drying agent. Note that the filler used for the first adhesive layer 111 preferably has a particle diameter greater than or equal to 1 nm and less than or equal to 1000 nm so as not to decrease bendability. If the particle diameter of the filler is large, generation of a defect or a crack could start at the filler when the light-emitting device is bent.

The protective layer 112 includes a material having low water permeability and a property of transmitting visible light. For example, an insulating layer containing nitrogen and silicon, such as a silicon nitride layer, a silicon nitride oxide layer, or a silicon oxynitride layer, is preferably used. An aluminum oxide layer may also be used.

When the plastic substrate 110 having a high refractive index is used, it is preferable that each of the first adhesive layer 111 and the protective layer 112 also have a high refractive index. The refractive indexes preferably increase in the order of the plastic substrate 110, the first adhesive layer 111, the protective layer 112, and the first electrode 117. For example, indium tin oxide (ITO), and zinc oxide to which aluminum is added (AZO), which can be suitably used for the first electrode 117, each have a refractive index of 1.8 to 2.1. Thus each of the plastic substrate 110, the first adhesive layer 111, and the protective layer 112 preferably has a refractive index of 1.6 or more, further preferably greater than or equal to 1.6 and less than or equal to 1.8.

By having a structure in which an inorganic filler having a high refractive index is dispersed into an organic resin, for example, the first adhesive layer 111 can have a higher refractive index than an adhesive layer formed of only the organic resin. In particular, an inorganic filler having a particle diameter as small as 40 nm or less is preferred, because such a filler can maintain optical transparency. As the protective layer 112, a silicon nitride oxide layer having a property of transmitting visible light can be suitably used, for example.

Examples of a material for the conductive layer 130 having a property of transmitting visible light include indium oxide, tin oxide, ITO, oxide of indium containing tungsten oxide, indium zinc oxide containing tungsten oxide, indium oxide containing titanium oxide, indium zinc oxide, indium tin oxide to which silicon oxide is added, and antimony oxide. Alternatively, a thin metal layer (e.g., silver) may be used as the conductive layer 130 having a property of transmitting visible light.

A voltage may be applied to the conductive layer 130 having a property of transmitting visible light so that the potential is controlled. For example, the potential of the conductive layer 130 having a property of transmitting visible light is a ground potential, whereby the effect of preventing electrical charge of the organic resin can be enhanced.

As the sealing layer 121, a single layer or a stacked layer of any of silicon nitride, silicon nitride oxide, aluminum oxide, and the like which are highly proof against moisture. Sealing may be performed in such a manner that an inorganic film having a high moisture-proof property such as silicon nitride, silicon nitride oxide, aluminum oxide and an organic film may be stacked. A metal substrate is preferably used as the sealing layer 121 because high reliability can be obtained at low cost. A metal substrate may be provided over the above-mentioned inorganic film having a high moisture-proof property. Further, a drying agent may be used with them.

In the flexible light-emitting device having such a structure according to this embodiment, the protective layer having sufficiently low water permeability which is formed at a temperature greater than or equal to the upper temperature limit of the plastic substrate is provided on the plastic substrate side which has high water permeability, whereby the influence of moisture which penetrates through the plastic substrate can be effectively reduced. Therefore, a light-emitting device with long lifetime can be achieved.

The flexible light-emitting device according to this embodiment includes the conductive layer having a property of transmitting visible light between the first adhesive layer and a transistor, so that malfunction of transistors due to electrical charge of the organic resin (electrical charge caused by ionic impurities included in the organic resin or static electricity in the manufacturing process) can be suppressed. Accordingly, it can be said that the flexible light-emitting device according to this embodiment is a flexible light-emitting device with high yield, high reliability, and favorable display characteristics without display unevenness.

In the layer to be separated which is formed over the formation substrate, a transistor, a light-emitting element, and the like may be formed in advance besides the protective layer. As the transistor, it is naturally possible to use a transistor that can be manufactured without a high-temperature process, such as a transistor using amorphous silicon or a transistor using an oxide semiconductor. It is also possible to employ a transistor using a crystalline semiconductor layer that requires a certain degree of heating or laser processing, such as crystalline silicon, because the transistor can be formed over the formation substrate having high heat resistance. Thus, the flexible light-emitting device according to this embodiment can be an active matrix flexible light-emitting device having a transistor that uses a crystalline semiconductor. In addition, the driver circuit portion or a CPU can be formed over the same substrate over which the pixel portion is formed, so that it is also possible to fabricate a flexible light-emitting device having great advantages in cost and manufacturing process over one that has a driver circuit portion or a CPU provided separately.

Figure 1C:
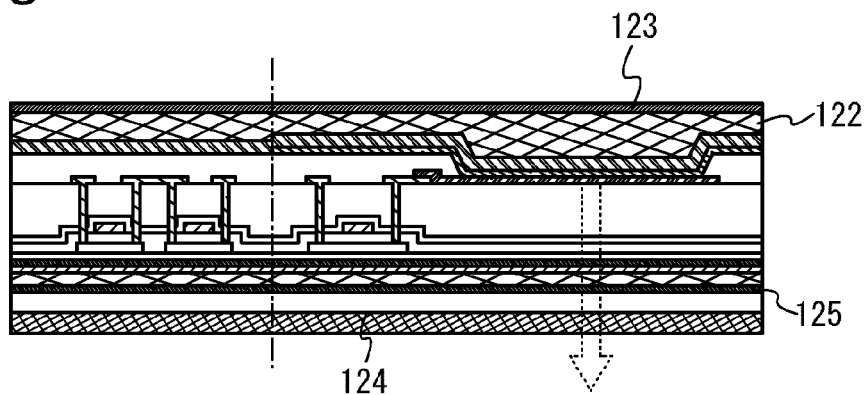

In addition, as illustrated in FIG. 1C, a metal substrate 123 having sufficient flexibility and low water permeability is used as a sealing substrate which faces the plastic substrate with the light-emitting element interposed therebetween, whereby the influence of moisture which enters through the sealing substrate can also be effectively suppressed. The flexible light-emitting device illustrated in FIG. 1C is provided with the protective layer 112 and the metal substrate 123, so that entry of moisture from both the plastic substrate and the metal substrate can be suppressed, which can realize a light-emitting device with long lifetime. The thickness of the metal substrate 123 is greater than or equal to 10 µm and less than or equal to 200 µm so as to be flexible. A thickness greater than or equal to 20 µm and less than or equal to 50 µm is preferable in order not to decrease bendability. Although there is no particular limitation on a material of the metal substrate, it is preferable to use aluminum, copper, nickel, a metal alloy such as an aluminum alloy or stainless steel, or the like. Note that the material of the metal substrate is preferably subjected to baking in a vacuum or plasma treatment in order that water adhered to its surface is removed, before the metal substrate is bonded.

Since the metal substrate 123 does not have a property of transmitting visible light with a thickness in the above range although it has sufficiently low water permeability and sufficient flexibility, the light-emitting device illustrated in FIG. 1C is a so-called bottom emission light-emitting device from which light emission is extracted through the plastic substrate 110 provided with a transistor. Note that the metal substrate 123 is bonded to the light-emitting element 127 with an adhesive layer interposed therebetween in a manner similar to that of the plastic substrate 110, and thus, a second adhesive layer 122 is provided between a second electrode 120 of the light-emitting element 127 and the metal substrate 123.

As a material of the second adhesive layer 122, a material that is the same as that of the first adhesive layer 111 can be used. For example, an adhesive such as a reactive curable adhesive, a thermosetting adhesive, or an anaerobic adhesive can be employed. Such an adhesive is made of an epoxy resin, an acrylic resin, a silicone resin, a phenol resin, or the like.

In order to increase the thermal conductance of the second adhesive layer 122, a material in which a thermally conductive filler is dispersed into a resin may be employed. The second adhesive layer 122 formed by dispersing a thermally conductive filler into a resin preferably has a thermal conductivity of 0.50 W/m·K or more, further preferably 1.0 W/m·K or more. As the thermally conductive filler, a material having a higher thermal conductivity than the above resin used for the second adhesive layer is used. In particular, a material having a thermal conductivity of 30 W/m·K or more is preferably used. Examples include aluminum which has a thermal conductivity of 260 W/m·K, aluminum nitride which has a thermal conductivity of 300 W/m·K, alumina which has a thermal conductivity of 36 W/m·K, boron nitride, silicon nitride, and the like. Another example of the thermally conductive filler is a metal particle of silver, copper having a thermal conductivity of 388 W/m·K, or the like. A filler functioning as a drying agent is preferably used as the thermally conductive filler because such a filler improves the moisture resistance of the second adhesive layer 122 in addition to the thermal conductivity. The thermally conductive filler and the filler functioning as a drying agent may be mixed and used. Zeolite is an example of the filler functioning as a drying agent. Note that the filler used for the second adhesive layer 122 preferably has a particle diameter greater than or equal to 1 nm and less than or equal to 1000 nm so as not to decrease bendability. If the particle diameter of the filler is large, generation of a defect or a crack could start at the filler when the light-emitting device is bent.

The metal substrate 123 can also be bonded with the use of a laminator. For example, there are a method in which a sheet-like adhesive and the metal substrate are attached to each other using a laminator and then bonded onto the light-emitting element using a laminator, a method in which an adhesive is printed on the metal substrate by screen printing or the like and then the metal substrate with the adhesive is bonded onto the light-emitting element using a laminator, and the like. Such a step is preferably performed under reduced pressure in order to reduce bubbles between the light-emitting element and the metal substrate.

A resin layer may be formed over the metal substrate 123. A resin layer disperses pressure applied to the metal substrate 123 and thus, the metal substrate 123 can be protected. The resin layer can be formed using one or more of thermosetting resin materials such as an epoxy resin, an acrylic resin, a silicone resin, a phenol resin, and a polyester resin, or one or more of thermoplastic resin materials such as polypropylene, polyethylene, polycarbonate, polystyrene, polyamide, polyetherketone, a fluorine resin, and polyethylenenaphthalate.

The resin layer may contain a fibrous body. When a thin metal foil with a thickness less than or equal to 20 μm is used as the metal substrate 123, the metal substrate 123 is likely to be broken (buckled). In order to prevent the metal substrate 123 from being broken and maintain the bendability, a material in which a glass fiber is filled with a resin may be formed so that a resin layer containing a fibrous body may be provided, for example. When a resin layer containing a fibrous body is provided, a flexible light-emitting device with high resistance to bending and break can be manufactured. As the fibrous body, for example, a glass fiber is preferable. As a method for forming a resin layer containing a fibrous body, there are a method in which a glass fiber filled with a resin is attached with the use of an adhesive, a method in which a glass fiber filled with an adhesive in a semi-cured state is placed over the metal substrate 123 and then, it is cured, and the like.

A heat radiation material layer may be formed over the metal substrate 123 or the resin layer. The heat radiation material layer is formed using a material having a higher thermal emissivity than materials used for the metal substrate 123 and the resin layer. A material having a thermal emissivity greater than or equal to 0.8, preferably greater than or equal to 0.9, is used for the heat radiation material layer. When a heat radiation material layer is provided, an increase in surface temperature of a light-emitting device can be reduced; thus, an increase in a drive voltage, the breakdown, and a decrease in the reliability of the light-emitting device due to heat generation can be prevented.

In this specification, the term "thermal emissivity" of a substance means the ratio of the amount of energy radiated from a surface of the substance at a certain temperature to the amount of energy radiated by a black body (a hypothetical substance that absorbs the whole amount of energy radiated thereto) at the same temperature.

Further, as illustrated in FIG. 1C, a coat layer 124 may be provided on a surface of the plastic substrate 110 which is opposite to the surface of the plastic substrate 110 which is provided with the light-emitting element and the like. The coat layer 124 can be formed with any of a variety of materials such as an organic film, an inorganic film, and a stacked film including an organic film and an inorganic film. The coat layer 124 means a hard coat layer (such as a silicon nitride layer) capable of protecting the surface of the plastic substrate 110 which is soft from scratches or the like, or a layer (such as an aramid resin layer) which can disperse pressure.

A conductive film having a property of transmitting visible light is further preferably used as the coat layer 124, because such a film can prevent buildup of static charge on the plastic substrate 110. Examples of a material of the conductive film having a property of transmitting visible light which is used for the coat layer 124 include indium oxide, tin oxide, ITO, indium oxide containing tungsten oxide, indium zinc oxide containing tungsten oxide, indium oxide containing titanium oxide, indium zinc oxide, indium tin oxide to which silicon oxide is added, antimony oxide, and the like. The coat layer 124 can be formed by a sputtering method, a printing method, a vacuum evaporation method, or the like.

A transistor or a pixel portion can be protected with the use of the coat layer 124 including a conductive film having a property of transmitting visible light, even if a human hand or finger charged with static electricity touches the plastic substrate 110 and discharges the static electricity.

Further, the coat layer 124 can function as a protective layer suppressing moisture penetration when it is provided so as to cover a side surface of the plastic substrate 110.

Further, a substrate that is provided with a waterproof layer 125 in advance may be used as the plastic substrate 110 so that moisture penetration is further suppressed. The waterproof layer 125 is preferably formed using a material having low water permeability, and can be formed using a layer containing nitrogen and silicon, such as a silicon nitride layer or a silicon nitride oxide layer. Alternatively, a layer containing nitrogen and aluminum or an aluminum oxide layer may be used.

Note that as for the coat layer 124 and the waterproof layer 125, one or both of them may be employed. Although FIG. 1C illustrates an example where the coat layer 124 and the waterproof layer 125 are applied to the flexible light-emitting device of FIG. 1A, these components can also naturally be applied to the flexible light-emitting device of FIG. 1B.

In each of FIGS. 1A to 1C, only one light-emitting element 127 is illustrated; however, in the case where the flexible light-emitting device in this embodiment is used on purpose to display images, a pixel portion including a plurality of light-emitting elements 127 is formed. When a full-color image is displayed, it is necessary to obtain light of at least three colors, i.e., red, green, and blue. The following are given as methods therefor: a method in which a necessary portion of each EL layer 119 is formed of an appropriate material for each color, a method in which all the light-emitting elements are formed to emit white light and the light is transmitted through a color filter layer so that each color is obtained, a method in which all the light-emitting elements are formed to emit light of blue or the color that has a shorter wavelength than blue so that each color is obtained through a color conversion layer, and the like.

FIGS. 2A to 2D each illustrate how a color filter layer (or a color conversion layer) of this embodiment is placed. In FIGS. 2A to 2D, a flexible light-emitting device includes a color filter layer (or a color conversion layer) 300 and a barrier layer 301. The barrier layer 301 is placed so as to protect a light-emitting element or a transistor from influence of a gas generated from the color filter layer (or the color conversion layer) 300, but is not necessarily provided. The color filter layer (or the color conversion layer) 300 is provided for a light-emitting element 127 of each color. The adjacent color filter layers may be overlapped at a portion other than an open region (a portion where the first electrode, the EL layer, and the second electrode are directly overlapped) of the light-emitting element 127. The color filter layer (or the color conversion layer) 300 and the barrier layer 301 may be formed only in the pixel portion or may be formed also in the driver circuit portion.

Figure 2A:
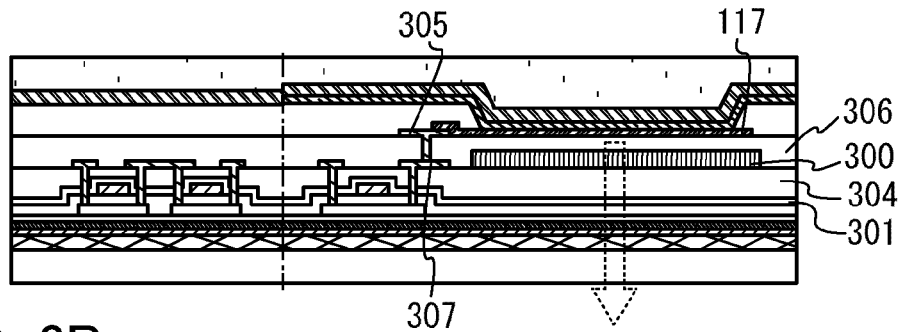
FIGS. 2A to 2D each illustrate a light-emitting device according to one embodiment.

In FIG. 2A, after an electrode 307 of a transistor is formed, the color filter layer 300 is formed over an interlayer insulating layer 304 of the TFT, and a planarization layer 306 is formed using an organic insulating film so as to planarize a step by the color filter layer. After that, a contact hole is formed in the planarization layer 306, an electrode 305 which connects the first electrode 117 of the light-emitting element and the electrode 307 of the transistor is formed, and the first electrode 117 of the light-emitting element is provided. The barrier layer 301 may be provided over the planarization layer 306.

Figure 2B:
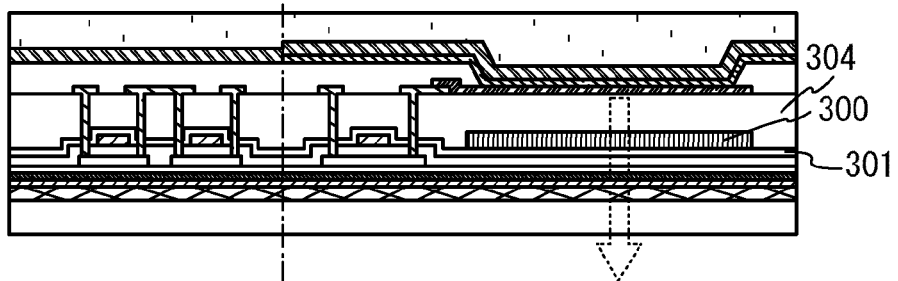

In addition, as illustrated in FIG. 2B, the color filter layer 300 may be provided below the interlayer insulating layer 304. In FIG. 2B, after the barrier layer 301 is formed, the color filter layer 300 is formed over the barrier layer 301. After that, the interlayer insulating layer 304 and the electrode 305 of the transistor are formed, and the first electrode 117 of the light-emitting element is provided.

Although FIGS. 2A to 2D each illustrate only a color filter layer (or a color conversion layer) of a single color, color filter layers (or color conversion layers) of red, blue, and green are formed at appropriate positions in appropriate shapes in a light-emitting device. Any arrangement can be adopted for the arrangement pattern of the color filter layers (or the color conversion layers), and stripe arrangement, diagonal mosaic arrangement, triangle mosaic arrangement, and the like may be used. In addition, in the case of using a white light-emitting element and a color filter layer, RGBW four pixel arrangement may be used. The RGBW four pixel arrangement is pixel arrangement which has a pixel provided with a color filter layer transmitting light of red, a pixel provided with a color filter layer transmitting light of blue, a pixel provided with a color filter layer transmitting light of green, and a pixel not provided with a color filter layer; this arrangement is effective in reducing power consumption and the like. It is preferable that the white light-emitting element includes, for example, red light, green light, and blue light according to the National Television Standard Committee (NTSC) and emits white light.

The color filter layer can be formed by using a known material. In the case of using a photosensitive resin as the color filter layer, the color filter layer may be patterned by exposing the color filter layer itself to light and then developing it, but it is preferred to perform patterning by dry etching since a minute pattern is necessary.

Figure 2C:
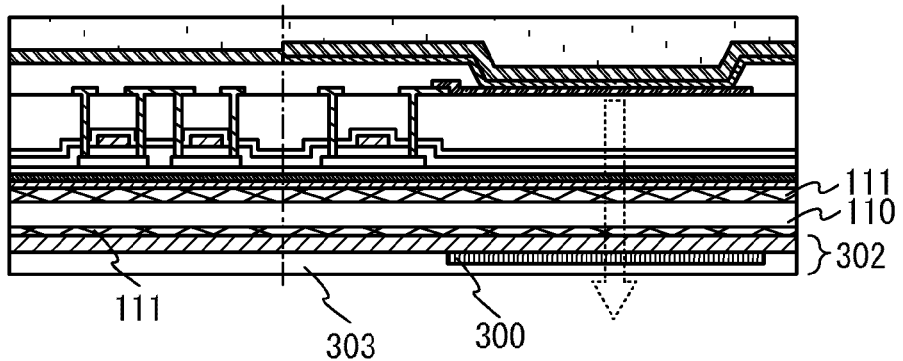

FIG. 2C illustrates an example of a structure in which a color filter substrate 302 provided with the color filter layer 300 is provided. In the case where the surface of the color filter substrate 302, which is not provided with the color filter layer 300, is attached to the plastic substrate 110 with use of the first adhesive layer 111, the color filter substrate 302 may be provided with a coat layer 303 for protecting the color filter layer 300 from scratches and the like. The coat layer 303 is formed with a material having a property of transmitting visible light, and the same material as that for the coat layer 124 can be used. In addition, although not illustrated, the surface of the color filter substrate 302, which is provided with the color filter layer 300, may be attached to the plastic substrate 110. Note that the color filter substrate 302 is a substrate obtained by forming the color filter layer 300 on any of various types of substrates having flexibility and a property of transmitting visible light, for example, a substrate formed using a material similar to that for the plastic substrate 110.

Figure 2D:
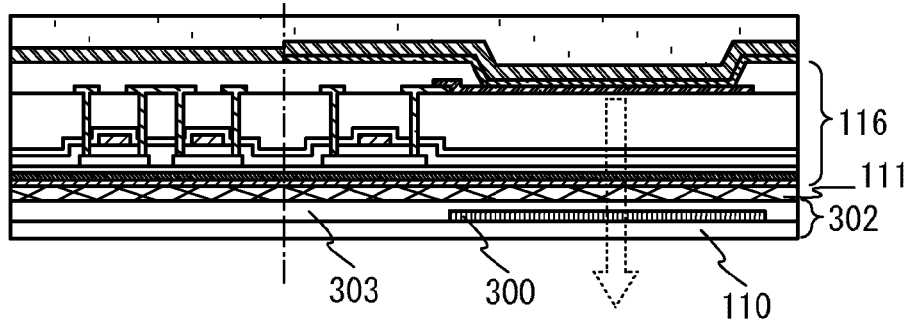

FIG. 2D illustrates an example of a structure in which the color filter substrate 302 obtained by providing, in advance, the color filter layer 300 for the plastic substrate 110 is directly attached to the layer 116 to be separated which has the first electrode. The color filter substrate 302 including the plastic substrate 110 provided with the color filter layer 300 is directly attached to the layer 116 to be separated which includes the first electrode, whereby the number of components can be reduced and the manufacturing cost can be reduced. The explanation for providing the color filter layer (or the color conversion layer) has been briefly made above. In addition to the above, a black matrix may be provided between light-emitting elements, or other known structures may be employed.

Next, as an example, a method for manufacturing a flexible light-emitting device in this embodiment including a transistor will be described with reference to FIGS. 3A to 3E and FIGS. 1A to 1C.

Figure 3A:
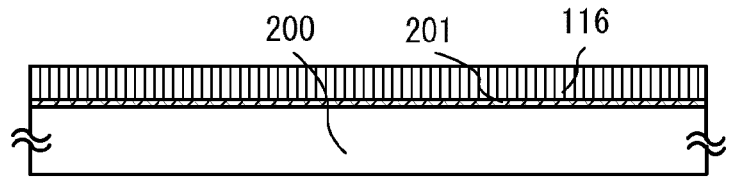
FIGS. 3A to 3E illustrate a manufacturing process of a light-emitting device according to one embodiment.
Figure 3B:
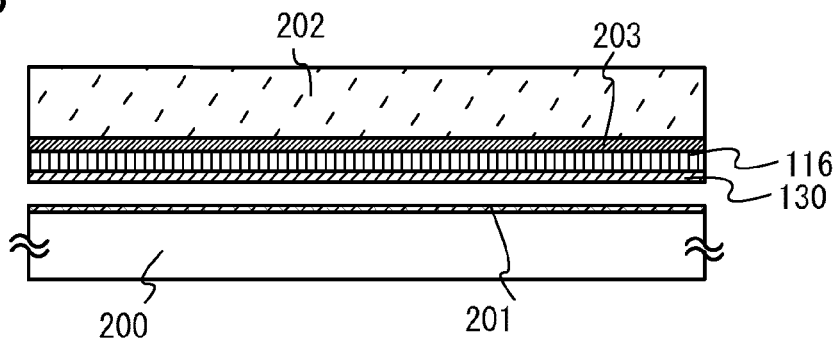

First, the layer 116 to be separated including the transistor, the first electrode 117, and the like is formed over a formation substrate 200 having an insulating surface, with a separation layer 201 interposed therebetween (see FIG. 3A).

As the formation substrate 200, it is possible to use a substrate having heat resistance which is sufficiently high to the extent that a high-quality protective layer can be formed, such as a glass substrate, a quartz substrate, a sapphire substrate, a ceramic substrate, or a metal substrate having a surface provided with an insulating layer.

Since a substrate with low flexibility which can be used for manufacture of normal displays is used for the formation substrate, a transistor for the pixel portion for high-definition display can be provided.

The separation layer 201 is formed by a sputtering method, a plasma CVD method, a coating method, a printing method, or the like to be a single layer or a stacked layer using an element such as tungsten, molybdenum, titanium, tantalum, niobium, nickel, cobalt, zirconium, zinc, ruthenium, rhodium, palladium, osmium, iridium, or silicon (Si); an alloy material containing the element as its main component; or a compound material containing the element as its main component. The crystalline structure of a layer containing silicon may be any one of an amorphous state, a microcrystalline state, and a polycrystalline state. Note that a coating method includes a spin-coating method, a droplet discharge method, a dispensing method, a nozzle-printing method, and a slot die coating method in its category here.

When the separation layer 201 has a single layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 201 has a stacked layer structure, a first layer is preferably formed using a tungsten layer, a molybdenum layer, or a layer containing a mixture of tungsten and molybdenum, and a second layer is preferably formed using an oxide, a nitride, an oxynitride, or a nitride oxide of tungsten, molybdenum, or a mixture of tungsten and molybdenum.

In the case where the separation layer 201 has a stacked layer structure of a layer containing tungsten and a layer containing an oxide of tungsten, the layer containing tungsten may be formed first and an insulating layer formed of an oxide may be formed over the layer containing tungsten so that the layer containing an oxide of tungsten can be formed at an interface between the tungsten layer and the insulating layer. This also applies to the case of forming a layer containing a nitride, an oxynitride, or a nitride oxide of tungsten. For example, after a layer containing tungsten is formed, a silicon nitride layer, a silicon oxynitride layer, or a silicon nitride oxide layer may be formed thereover. Further, the surface of the layer containing tungsten may be subjected to thermal oxidation treatment, oxygen plasma treatment, or treatment using a strong oxidizing solution such as ozone water to form the layer containing an oxide of tungsten. Furthermore, plasma treatment or heat treatment may be performed in an oxygen gas, a nitrogen gas, a dinitrogen monoxide gas, or a mixed gas of any of these gases and another gas.

In order to form the layer 116 to be separated, first, the protective layer 112 is formed over the separation layer 201. The protective layer 112 can be a layer which is dense and has very low water permeability by forming an insulating layer containing nitrogen and silicon such as a silicon nitride layer, a silicon oxynitride layer, or a silicon nitride oxide layer by plasma CVD at a temperature in the range of 250° C. to 400° C. while setting other conditions to be known conditions.

Then, the base insulating layer 113 is formed in order to stabilize the characteristics of the transistor which is to be formed later. The base insulating layer 113 can be formed as a single layer or a stacked layer by using an inorganic insulating layer of silicon oxide, silicon nitride, silicon oxynitride, silicon nitride oxide, or the like. When the protective layer 112 also serves as an insulating layer which is a base, the base insulating layer 113 is not necessarily formed.

A semiconductor layer included in the transistor can be formed using any of the following materials: an amorphous semiconductor (hereinafter also referred to as "AS") manufactured by a vapor-phase growth method using a semiconductor source gas typified by silane or germane or a sputtering method; a polycrystalline semiconductor formed by crystallizing the amorphous semiconductor with the use of light energy or thermal energy; a microcrystalline (also referred to as semi-amorphous or microcrystal) semiconductor (hereinafter also referred to as "SAS"); a semiconductor containing an organic material as its main component; and the like. The semiconductor layer can be formed by a sputtering method, an LPCVD method, a plasma CVD method, or the like.

The microcrystalline semiconductor belongs to an intermediate metastable state between an amorphous semiconductor and a single crystal semiconductor when Gibbs free energy is considered. That is, the microcrystalline semiconductor layer is a semiconductor layer having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a wave number lower than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline silicon contains hydrogen or halogen of greater than or equal to 1 at. % to terminate a dangling bond. Moreover, microcrystalline silicon is made to contain a rare gas element such as helium, argon, krypton, or neon to further enhance its lattice distortion, whereby stability is increased and a favorable microcrystalline semiconductor layer can be obtained.

This microcrystalline semiconductor layer can be formed by a high-frequency plasma CVD method with a frequency of several tens of MHz to several hundreds of MHz or by a microwave plasma CVD method with a frequency greater than or equal to 1 GHz. For example, the microcrystalline semiconductor layer can be formed with a dilution of $SiH_4$, $Si_2H_6$, $SiH_2Cl_2$, $SiHCl_3$, $SiCl_4$, or $SiF_4$ with hydrogen. The flow rate ratio of hydrogen to such a compound in this case is set to greater than or equal to 5:1 and less than or equal to 200:1, preferably greater than or equal to 50:1 and less than or equal to 150:1, further preferably 100:1. Further, in addition to hydrogen, one or more kinds of rare gas elements selected from helium, argon, krypton, or neon are used for a dilution, so that the microcrystalline semiconductor layer can be formed.

As an example of an amorphous semiconductor, hydrogenated amorphous silicon can be given, and as an example of a crystalline semiconductor, polysilicon or the like can be given. Examples of polysilicon (polycrystalline silicon) include so-called high-temperature polysilicon that contains polysilicon which is formed at a process temperature greater than or equal to 800° C. as its main component, so-called low-temperature polysilicon that contains polysilicon which is formed at a process temperature of less than or equal to 600° C. as its main component, polysilicon obtained by crystallizing amorphous silicon by using an element that promotes crystallization or the like, and the like. It is needless to say that as mentioned above, a microcrystalline semiconductor or a semiconductor containing a crystal phase in a part of a semiconductor layer can be used.

As a material of the semiconductor layer, as well as an element such as silicon or germanium, a compound semiconductor such as GaAs, InP, SiC, ZnSe, GaN, or SiGe can be used. Alternatively, an oxide semiconductor such as zinc oxide, tin oxide, magnesium zinc oxide, gallium oxide, or indium oxide, an oxide semiconductor including two or more of the above oxide semiconductors, or the like can be used. For example, an oxide semiconductor including zinc oxide, indium oxide, and gallium oxide can also be used. In the case of using zinc oxide for the semiconductor layer, the gate insulating film may be formed of $Y_2O_3$, $Al_2O_3$, or $TiO_2$, a stacked layer thereof, or the like, and the gate electrode layer, the source electrode layer, and the drain electrode layer may be formed of ITO, aluminum, titanium, tungsten, or the like. In addition, indium, gallium, or the like can be added to zinc oxide. Note that a transparent transistor using an oxide semiconductor layer having a property of transmitting visible light as a semiconductor layer can also be used as a transistor in a pixel portion. When such a transparent transistor is formed so as to overlap with a light-emitting element, an area ratio of a light-emitting element in a pixel, that is, a so-called aperture ratio can be increased, and a flexible display device with high luminance and high resolution can be formed. Further, when a gate electrode, a source electrode, and a drain electrode of a transparent transistor are formed using a conductive film having a property of transmitting visible light, an aperture ratio can be further increased.

In the case of using a crystalline semiconductor layer for the semiconductor layer, the crystalline semiconductor layer may be formed by any of various methods (such as a laser crystallization method, a thermal crystallization method, and a thermal crystallization method using an element promoting crystallization, such as nickel). Also, a microcrystalline semiconductor which is an SAS can be crystallized by being irradiated with laser light to increase its crystallinity. When the element that promotes crystallization is not introduced, prior to irradiating an amorphous silicon film with laser light, the amorphous silicon film is heated at 500° C. for one hour under a nitrogen atmosphere to release hydrogen contained in the amorphous silicon film such that the concentration of hydrogen becomes less than or equal to $1\times10^{20}$ atoms/cm$^3$. This is because the amorphous silicon film is destroyed when the amorphous silicon film containing a high amount of hydrogen is irradiated with laser light.

A method for introducing a metal element into an amorphous semiconductor layer is not limited to a particular method as long as it is a method capable of providing the metal element on a surface or inside of the amorphous semiconductor layer. For example, a sputtering method, a CVD method, a plasma processing method (including a plasma CVD method), an adsorption method, or a method for applying a solution of metal salt, can be used. In the above mentioned methods, the method using a solution is simple and has an advantage that the concentration of a metal element can easily be adjusted. In addition, at this time, in order to improve the wettability of the surface of the amorphous semiconductor layer to spread an aqueous solution on the entire surface of the amorphous semiconductor layer, an oxide film is preferably formed by UV light irradiation in an oxygen atmosphere, a thermal oxidation method, treatment using ozone water containing hydroxy radical or a hydrogen peroxide solution, or the like.

In addition, in a crystallization step in which the amorphous semiconductor layer is crystallized to form a crystalline semiconductor layer, the crystallization may be performed by adding an element which promotes crystallization (also referred to as a catalyst element or a metal element) to the amorphous semiconductor layer and performing heat treatment (at 550° C. to 750° C. for 3 minutes to 24 hours). As the element which promotes (accelerates) the crystallization, one or more of iron, nickel, cobalt, ruthenium, rhodium, palladium, osmium, iridium, platinum, copper, and gold can be used.

In order to remove or reduce the element which promotes crystallization from the crystalline semiconductor layer, a semiconductor layer containing an impurity element is formed in contact with the crystalline semiconductor layer and is made to function as a gettering sink. As the impurity element, an impurity element imparting n-type conductivity, an impurity element imparting p-type conductivity, a rare gas element, or the like can be used. For example, one or more of phosphorus, nitrogen, arsenic, antimony, bismuth, boron, helium, neon, argon, krypton, and xenon can be used. The semiconductor layer containing a rare gas element is formed over the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. Then, the semiconductor layer containing a rare gas element, which serves as a gettering sink, is removed.

The amorphous semiconductor layer may be crystallized by using combination of heat treatment and laser light irradiation. The heat treatment or the laser light irradiation may be carried out several times, separately.

Alternatively, the crystalline semiconductor layer may be directly formed over the base insulating layer over the formation substrate by a plasma method. Alternatively, the crystalline semiconductor layer may be selectively formed over the base insulating layer over the formation substrate by a plasma method.

As the semiconductor layer containing an organic material as its main component, a semiconductor layer containing, as its main component, a substance which contains a certain amount of carbon or an allotrope of carbon (excluding diamond), which is combined with another element, can be used. Specifically, pentacene, tetracene, a thiophene oligomer derivative, a phenylene derivative, a phthalocyanine compound, a polyacetylene derivative, a polythiophene derivative, a cyanine dye, and the like can be given.

The gate insulating layer and the gate electrode may be formed with a known structure and a known method. For example, the gate insulating layer may be formed with a known structure such as a single layer structure of silicon oxide or a stacked layer structure including silicon oxide and silicon nitride, and the gate electrode may be formed using any of silver, gold, copper, nickel, platinum, palladium, iridium, rhodium, tantalum, aluminum, tantalum, molybdenum, cadmium, zinc, iron, titanium, silicon, germanium, zirconium, or barium; or an alloy material or a compound material containing any of the elements as its main component by a CVD method, a sputtering method, a droplet discharge method, or the like. In addition, a semiconductor layer typified by a polycrystalline silicon film doped with an impurity element such as phosphorus or an Ag—Pd—Cu alloy may be used. Further, either a single layer structure or a stacked layer structure may be employed.

Note that although FIGS. 1A to 1C each illustrate an example of a top gate transistor, a bottom gate transistor or a transistor with other known structures may also be used.

Next, an interlayer insulating layer is formed. The interlayer insulating layer can be formed using an inorganic insulating material or an organic insulating material to have a single layer structure or a stacked layer structure. As the organic insulating material, for example, acrylic, polyimide, polyamide, polyimide amide, benzocyclobutene, or the like can be used. Although a structure including the first interlayer insulating layer 128 and the second interlayer insulating layer 129 is illustrated in FIGS. 1A to 1C, this is just an example, and the structure of the interlayer insulating layer is not limited thereto.

The interlayer insulating layer which is formed is patterned and etched, and a contact hole which reaches the semiconductor layer of the transistor is formed in the interlayer insulating layer, the gate insulating layer, and the like. Then, a conductive metal film is deposited by a sputtering method or a vacuum evaporation method and etched to form an electrode and a wiring of the transistor. A drain electrode of the transistor for the pixel portion is formed so as to partially overlap with a first electrode which is a pixel electrode, whereby the drain electrode of the pixel transistor and the first electrode are electrically connected to each other.

Then, the first electrode 117 is formed using a conductive layer having a property of transmitting visible light. When the first electrode 117 is an anode, indium oxide ($In_2O_3$), ITO, or the like can be used as a material of the conductive layer having a property of transmitting visible light, and the first electrode 117 can be formed by a sputtering method, a vacuum evaporation method, or the like. Alternatively, an alloy of indium oxide and zinc oxide ($In_2O_3$—ZnO) may be used. In addition, zinc oxide is also an appropriate material, and moreover, zinc oxide to which gallium is added (ZnO: Ga) to increase conductivity and a property of transmitting visible light, or the like can be used. When the first electrode 117 is a cathode, an extremely thin film of a material with a low work function such as aluminum can be used. Alternatively, a stacked layer structure which has a thin layer of such a substance and the above-mentioned conductive layer having a property of transmitting visible light can be employed.

Further, a material whose reflective index is close to that of an organic EL material, such as zinc oxide to which aluminum is added (AZO), is preferably used for the first electrode 117 because light extraction efficiency is improved.

Then, an insulating layer is formed using an organic insulating material or an inorganic insulating material so as to cover the interlayer insulating layer and the first electrode 117. The insulating layer is processed such that the surface of the first electrode 117 is exposed and the insulating layer covers an end portion of the first electrode 117, whereby the partition wall 118 is formed.

Through the above process, the layer 116 to be separated can be formed.

Next, the layer 116 to be separated and a temporary supporting substrate 202 are bonded to each other using an adhesive 203 for separation, and the layer 116 to be separated is separated from the formation substrate 200 at the separation layer 201. By this process, the layer 116 to be separated is placed on the temporary supporting substrate 202 side. Next, the layer 116 to be separated which is separated from the formation substrate 200 to expose the separation layer 201 or the protective layer 112 is provided with the conductive layer 130 having a property of transmitting visible light (see FIG. 3B). The conductive layer 130 having a property of transmitting visible light can be formed with the above-mentioned materials, by a sputtering method, a printing method, a vacuum evaporation method, or the like.

As the temporary supporting substrate 202, a glass substrate, a quartz substrate, a sapphire substrate, a ceramic substrate, a metal substrate, and the like can be used. Further, a plastic substrate which has heat resistance high enough to resist a temperature of the manufacturing process of this embodiment, or a flexible substrate such as a film may be used.

As the adhesive 203 for separation which is used here, an adhesive which is soluble in water or a solvent, an adhesive which is capable of being plasticized upon irradiation of UV light, and the like are used so that the temporary supporting substrate 202 and the layer 116 to be separated can be chemically or physically separated when necessary.

Any of various methods can be used as appropriate as the process for transferring the layer to be separated to the temporary supporting substrate. When, as the separation layer, a layer including a metal oxide film is formed on the side in contact with the layer to be separated, the metal oxide film is embrittled by being crystallized, and thus the layer to be separated can be separated from the formation substrate. When an amorphous silicon film containing hydrogen is formed as the separation layer between the formation substrate having high heat resistance and the layer to be separated, by removing the amorphous silicon film by laser light irradiation or etching, the layer to be separated can be separated from the formation substrate. In addition, after a layer including a metal oxide film is formed as the separation layer on the side in contact with the layer to be separated, the metal oxide film is embrittled by being crystallized, and a part of the separation layer is removed by etching using a solution or a halogen fluoride gas such as $NF_3$, $BrF_3$, or $ClF_3$, the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate.

Furthermore, a method in which the formation substrate over which the layer to be separated is formed is removed mechanically or by etching using a solution or a halogen gas such as $NF_3$, $BrF_3$, or $ClF_3$, or the like may be used. In this case, the separation layer is not necessarily provided.

When a plurality of the above-described separation methods is combined, the transfer process can be conducted easily. For example, separation can be performed with physical force (by a machine or the like) after performing laser light irradiation, etching on the separation layer with a gas, a solution, or the like, or mechanical removal with a sharp knife, scalpel, or the like so that the separation layer and the layer to be separated can be easily separated from each other.

Alternatively, separation of the layer to be separated from the formation substrate may be carried out after a liquid is made to penetrate an interface between the separation layer and the layer to be separated. Further alternatively, the separation may be performed while pouring a liquid such as water during the separation.

As another separation method, when the separation layer 201 is formed using tungsten, the separation may be performed while the separation layer 201 is etched with the use of a mixed solution of ammonia water and a hydrogen peroxide solution.

Figure 3C:
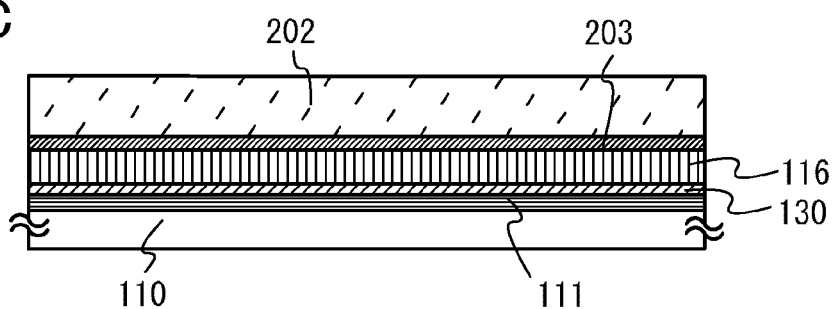
Figure 3D:
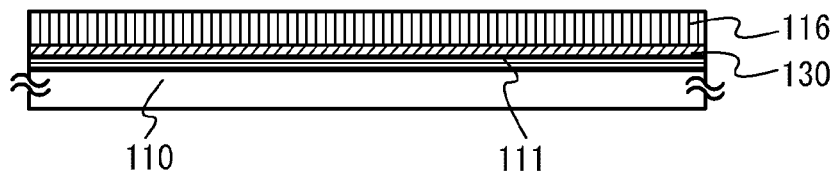

Next, the plastic substrate 110 is bonded to the conductive layer 130 having a property of transmitting visible light using the first adhesive layer 111 which is formed of a different adhesive from the adhesive 203 for separation (see FIG. 3C).

The materials for the plastic substrate 110 and the first adhesive layer 111 are as given above. The plastic substrate 110 may be provided with the waterproof layer 125 in advance.

After that, the temporary supporting substrate 202 is removed by dissolving or plasticizing the adhesive 203 for separation. After the temporary supporting substrate 202 is removed, the adhesive 203 for separation is removed using water, a solvent, or the like so as to expose the first electrode 117 of the light-emitting element (see FIG. 3D).

Through the above process, the layer 116 to be separated in which the transistor and up to the first electrode 117 of the light-emitting element are formed, can be manufactured over the plastic substrate 110.

After the first electrode 117 is exposed, the EL layer 119 containing a light-emitting organic compound is formed. There is no particular limitation on a stacked layer structure of the EL layer 119. A layer containing a substance having a high electron-transport property, a layer containing a substance having a high hole-transport property, a layer containing a substance having a high electron-injection property, a layer containing a substance having a high hole-injection property, a layer containing a bipolar substance (a substrate having a high electron-transport property and a high hole-transport property), and the like are appropriately combined. For example, an appropriate combination of any of a hole-injection layer, a hole-transport layer, a light-emitting layer, an electron-transport layer, an electron-injection layer, and the like can be formed.

In this embodiment, a structure is explained in which the EL layer includes a hole-injection layer, a hole-transport layer, a light-emitting layer, and an electron-transport layer. Specific materials to form each of the layers are given below.

The hole-injection layer is a layer that is provided in contact with an anode and contains a substance with a high hole-injection property. Specifically, molybdenum oxide, vanadium oxide, ruthenium oxide, tungsten oxide, manganese oxide, or the like can be used. Alternatively, the hole-injection layer can also be formed using any of the following materials: a phthalocyanine compound such as phthalocyanine ($H_2PC$) or copper phthalocyanine (CuPc); an aromatic amine compound such as 4,4'-bis[N-(4-diphenylaminophenyl)-N-phenylamino]biphenyl (DPAB) or N,N'-bis[4-[bis(3-methylphenyl)amino]phenyl]-N,N'-diphenyl-[1,1'-biphenyl]-4,4'-diamine (DNTPD); a high-molecular compound such as poly(3,4-ethylenedioxythiophene)/poly(styrenesulfonic acid) (PEDOT/PSS); and the like.

Alternatively, as the hole-injection layer, a composite material containing a substance with a high hole-transport property and an acceptor substance can be used. Note that, by using the composite material containing the substance with a high hole-transport property and the acceptor substance, a material used to form an electrode can be selected regardless of its work function. In other words, besides a material with a high work function, a material with a low work function can also be used as the first electrode 117. As the acceptor substance, 7,7,8,8-tetracyano-2,3,5,6-tetrafluoroquinodimethane ($F_4$-TCNQ), chloranil, and the like can be given. In addition, a transition metal oxide is given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is preferable since it can be easily treated due to its stability in the air and low hygroscopic property.

As the substance having a high hole-transport property used for the composite material, any of various compounds such as an aromatic amine compound, a carbazole derivative, aromatic hydrocarbon, oligomer, dendrimer, or polymer can be used. Note that the organic compound used for the composite material is preferably an organic compound having a high hole-transport property. Specifically, a substance having a hole mobility of greater than or equal to $10^{-6}$ cm$^2$/Vs is preferably used. However, substances other than these substances may also be used as long as a hole-transport property thereof is higher than an electron-transport property thereof. The organic compound that can be used for the composite material is specifically shown below.

Examples of the aromatic amine compounds include N,N'di(p-tolyl)-N,N'-diphenyl-p-phenylenediamine (DTDPPA), 4,4'-bis[N-(4-diphenylaminophenyl)-N-phenylamino]biphenyl (DPAB), N,N'-bis[4-[bis(3-methylphenyl)amino]phenyl]-N,N'-diphenyl-[1,1'-biphenyl]-4,4'-diamine (DNTPD), 1,3,5-tris[N-(4-diphenylaminophenyl)-N-phenylamino]benzene (DPA3B), and the like.

Examples of the carbazole derivatives which can be used for the composite material include 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and the like.

In addition, examples of the carbazole derivatives which can be used for the composite material include 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. As well as these compounds, pentacene, coronene, or the like can be used. As described above, use of an aromatic hydrocarbon which has a hole mobility of greater than or equal to $1\times10^{-6}$ cm$^2$/Vs and has 14 to 42 carbon atoms is more preferable.

The aromatic hydrocarbon that can be used for the composite material may have a vinyl skeleton. As an aromatic hydrocarbon having a vinyl group, for example, 4,4'-bis(2,2-diphenylvinyl)biphenyl (DPVBi), 9,10-bis[4-(2,2-diphenylvinyl)phenyl]anthracene (DPVPA), and the like are given.

High-molecular compounds such as poly(N-vinylcarbazole) (PVK), poly(4-vinyltriphenylamine) (PVTPA), poly[N-(4-{N'-[4-(4-diphenylamino)phenyl]phenyl-N'-phenylamino}phenyl)methacrylamide] (PTPDMA), poly[N, N'-bis(4-butylphenyl)-N,N'-bis(phenyl)benzidine] (Poly-TPD), and the like can also be used.

The hole-transport layer is a layer that contains a substance with a high hole-transport property. Examples of the substance having a high hole-transport property include aromatic amine compounds such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino]triphenylamine (MTDATA), 4,4'-bis[N-(spiro-9,9'-bifluoren-2-yl)-N-phenylamino]biphenyl (BSPB), and the like. The substances described here are mainly substances having a hole mobility of greater than or equal to $10^{-6}$ cm$^2$/Vs. However, a substance other than the above-described substances may also be used as long as a hole-transport property thereof is higher than an electron-transport property thereof. Note that the layer containing the substance with a high hole-transport property is not limited to a single layer, and two or more layers containing the aforementioned substances may be stacked.

Further, a high-molecular compound such as PVK or PVTPA can also be used for the hole-transport layer.

The light-emitting layer is a layer containing a light-emitting substance. The light-emitting layer may be a light-emitting layer containing a light-emitting substance as its main component, or may be a so-called host-guest type light-emitting layer, in which a light-emitting material is dispersed in a host material.

There is no particular limitation on the light-emitting substance that is used, and known fluorescent materials or phosphorescent materials can be used. As fluorescent materials, for example, in addition to N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), and the like, there are fluorescent materials with an emission wavelength of greater than or equal to 450 nm, such as 4-(9H-carbazol-9-yl)-4'-(9,10-diphenyl-2-anthryl)triphenylamine (2YGAPPA), N,9-diphenyl-N-[4-(10-phenyl-9-anthryl)phenyl]-9H-carbazol-3-amine (PCAPA), perylene, 2,5,8,11-tetra-tert-butylperylene (TBP), 4-(10-phenyl-9-anthryl)-4'-(9-phenyl-9H-carbazol-3-yl)triphenylamine (PCBAPA), N,N''-(2-tert-butylanthracene-9,10-diyldi-4,1-phenylene)bis[N,N',N'-triphenyl-1,4-phenylenediamine] (DPABPA), N,9-diphenyl-N-[4-(9,10-diphenyl-2-anthryl)phenyl]-9H-carbazol-3-amine (2PCAPPA), N-[4-(9,10-diphenyl-2-anthryl)phenyl]-N,N',N'-triphenyl-1,4-phenylenediamine (2DPAPPA), N,N,N',N',N'',N'',N''',N'''-octaphenyldibenzo[g,p]chrysene-2,7,10,15-tetraamine (DBC1), coumarin 30, N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), N-(9,10-diphenyl-2-anthryl)-N,N',N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)-N-[4-(9H-carbazol-9-yl)phenyl]-N-phenylanthracen-2-amine (2YGABPhA), N,N,9-triphenylanthracen-9-amine (DPhAPhA), coumarin 545T, N,N'-diphenylquinacridone (DPQd), rubrene, 5,12-bis(1,1'-biphenyl-4-yl)-6,11-diphenyltetracene (BPT), 2-(2-{2-[4-(dimethylamino)phenyl]ethenyl}-6-methyl-4H-pyran-4-ylidene)propanedinitrile (DCM1), 2-{2-methyl-6-[2-(2,3,6,7-tetrahydro-1H,5H-benzo[ij]quinolizin-9-yl)ethenyl]-4H-pyran-4-ylidene}propanedinitrile (DCM2), N,N,N',N'-tetrakis(4-methylphenyl)tetracene-5,11-diamine (p-mPhTD), 7,14-diphenyl-N,N,N',N'-tetrakis(4-methylphenyl)acenaphtho[1,2-a]fluoranthene-3,10-diamine (p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTB), 2-(2,6-bis{2-[4-(dimethylamino)phenyl]ethenyl}-4H-pyran-4-ylidene) propanedinitrile (BisDCM), and 2-{2,6-bis[2-(8-methoxy-1,1,7,7-tetramethyl-2,3,6,7-tetrahydro-1H,5H-benzo[ij] quinolizin-9-yl)ethenyl]-4H-pyran-4-ylidene}propanedinitrile (BisDCJTM). As phosphorescent materials, for example, in addition to bis[2-(4'6'-difluorophenyl)pyridinato-N,C$^{2'}$]iridium(III)tetrakis(1-pyrazolyl)borate (FIr6) and the like, there are phosphorescent materials with an emission wavelength in the range of 470 nm to 500 nm, such as bis[2-(4',6'-difluorophenyl)pyridinato-N,C$^{2'}$]iridium(III) picolinate (FIrpic), bis[2-(3',5'-bistrifluoromethylphenyl)pyridinato-N,C$^{2'}$]iridium(III)picolinate (Ir(CF$_3$ppy)$_2$(pic)), and bis[2-(4',6'-difluorophenyl)pyridinato-N,C$^{2'}$]iridium(III) acetylacetonate (FIracac); phosphorescent materials with an emission wavelength of greater than or equal to 500 nm (materials which emit green light), such as tris(2-phenylpyridinato)iridium(III) (Ir(ppy)$_3$), bis(2-phenylpyridinato)iridium(III)acetylacetonate (Ir(ppy)$_2$(acac)), tris(acetylacetonato)(monophenanthroline)terbium(III) (Tb(acac)$_3$(Phen)), bis(benzo[h]quinolinato)iridium(III)acetylacetonate (Ir(bzq)$_2$(acac)), bis(2,4-diphenyl-1,3-oxazolato-N,C$^{2'}$)iridium(III)acetylacetonate (Ir(dpo)$_2$(acac)), bis[2-(4'-perfluorophenylphenyl)pyridinato]iridium(III)acetylacetonate (Ir(p-PF-ph)$_2$(acac)), bis(2-phenylbenzothiazolato-N,C$^{2'}$)iridium(III) acetylacetonate (Ir(bt)$_2$(acac)), bis[2-(2'-benzo[4,5-α] thienyl)pyridinato-N,C$^{3'}$]iridium(III)acetylacetonate (Ir(btp)$_2$(acac)), bis(1-phenylisoquinolinato-N,C$^{2'}$)iridium(III) acetylacetonate (Ir(piq)$_2$(acac)), (acetylacetonato)bis[2,3-bis(4-fluorophenyl)quinoxalinato]iridium(III) (Ir(Fdpq)$_2$(acac)), (acetylacetonato)bis(2,3,5-triphenylpyrazinato) iridium(III) (Ir(tppr)$_2$(acac)), (2,3,7,8,12,13,17,18-octaethyl-21H,23H-porphyrinato)platinum(II) (PtOEP), tris(1,3-diphenyl-1,3-propanedionato)(monophenanthroline) europium(III) (Eu(DBM)$_3$(Phen)), and tris[1-(2-thenoyl)-3,3,3-trifluoroacetonato](monophenanthroline)europium(III) (Eu(TTA)$_3$(Phen)); and the like. The light-emitting substances can be selected from the above-mentioned materials or other known materials in consideration of the emission color of each of the light-emitting elements.

As the host material, for example, the following can be given: metal complexes such as tris(8-quinolinolato)aluminum(III) (Alq), tris(4-methyl-8-quinolinolato)aluminum(III) (Almq$_3$), bis(10-hydroxybenzo[h]quinolinato)beryllium(II) (BeBq$_2$), bis(2-methyl-8-quinolinolato)(4-phenylphenolato) aluminum(III) (BAlq), bis(8-quinolinolato)zinc(II) (abbreviation: Znq), bis[2-(2-benzoxazolyl)phenolato]zinc(II) (abbreviation: Zn(BOX)$_2$), bis[2-(2-benzothiazolyl)phenolato] zinc(II) (abbreviation: Zn(BTZ)$_2$), and bis[2-(2-benzothiazolyl)phenolato]zinc(II) (ZnBTZ); heterocyclic compounds such as 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ), 2,2',2''-(1,3,5-benzenetriyl)-tris(1-phenyl-1H-benzimidazole) (TPBI), bathophenanthroline (BPhen), bathocuproine (BCP), and 9-[4-(5-phenyl-1,3,4-oxadiazol-2-yl)phenyl]-9H-carbazole (CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. The following is specifically given as the condensed polycyclic aromatic compound: DPAnth; PCAPA; YGAPA; 2PCAPA; DBC1; CzPA; DPPA; DNA; t-BuDNA; N,N-diphenyl-9-[4-(10-phenyl-9-anthryl)phenyl]-9H-carbazol-3-amine (CzAlPA); 4-(10-phenyl-9-anthryl)triphenylamine (DPhPA); N,9-diphenyl-N-{4-[4-(10-phenyl-9-anthryl)phenyl]phenyl}-9H-carbazol-3-amine (PCAPBA); 6,12-dimethoxy-5,11-diphenylchrysene, 3,6-diphenyl-9-[4-(10-phenyl-9-anthryl)phenyl]-9H-carbazole (DPCzPA), 9,9'-bianthryl (BANT), 9,9'-(stilbene-3,3'-diyl)diphenanthrene (DPNS), 9,9'-(stilbene-4,4'-diyl)diphenanthrene (DPNS2), 3,3',3'''-(benzene-1,3,5-triyl)tripyrene (TPB3), and the like. A substance is selected from these substances or other known substances so as to have a larger energy gap (or triplet excitation energy in the case of phosphorescence) than the light-emitting substance dispersed in the host material and has a carrier-transport property as needed for the light-emitting layer.

The electron-transport layer is a layer that contains a substance with a high electron-transport property. For example, a layer containing a metal complex having a quinoline skeleton or a benzoquinoline skeleton, such as Alq, Almq$_3$, BeBq$_2$, or BAlq can be used. Alternatively, a metal complex having an oxazole-based or thiazole-based ligand, such as Zn(BOX)$_2$ or Zn(BTZ)$_2$ can be used. Besides the metal complexes, PBD, OXD-7, TAZ, BPhen, BCP, or the like can also be used. The substances described here are mainly those having an electron mobility of greater than or equal to $10^{-6}$ cm$^2$/Vs. Note that a substance other than the above substances may also be used as the electron-transport layer as long as an electron-transport property thereof is higher than a hole-transport property thereof.

Further, the electron-transport layer may be formed as not only a single layer but also as a stacked layer in which two or more layers formed using the above mentioned substances are stacked.

Further, a layer for controlling transport of electrons may be provided between the electron-transport layer and the light-emitting layer. The layer for controlling transport of electrons is a layer in which a small amount of a substance having a high electron-trapping property is added to a layer containing the above-mentioned substances having a high electron-transport property. The layer for controlling transport of electrons controls transport of electrons, which enables adjustment of carrier balance. Such a structure is very effective in suppressing a problem (such as shortening of element lifetime) caused by a phenomenon that an electron passes through the light-emitting layer.

Further, an electron-injection layer may be provided so as to be in contact with the electrode functioning as a cathode. As the electron-injection layer, an alkali metal, an alkaline earth metal, or a compound thereof, such as lithium, cesium, calcium, lithium fluoride, cesium fluoride, calcium fluoride, or the like can be employed. For example, a layer which contains both a substance having an electron-transport property and an alkali metal, an alkaline earth metal, or a compound thereof, e.g., a layer of Alq containing magnesium, can be used. Note that electrons can be efficiently injected from the second electrode 120 by using, as the electron-injection layer, a layer containing a substance having an electron-transport property to which an alkali metal or an alkaline earth metal is added.

The second electrode 120 is formed over the EL layer 119. When the second electrode 120 is used as a cathode, a metal, an alloy, an electrically conductive compound, a mixture thereof, or the like having a low work function (specifically, a work function of less than or equal to 3.8 eV, is preferably used as a substance for the second electrode 120. As a specific example of such a cathode material, an element belonging to Group 1 or Group 2 of the periodic table, i.e., an alkali metal such as lithium or cesium, an alkaline earth metal such as magnesium, calcium, or strontium, an alloy containing any of these metals (such as Mg—Ag or Al—Li), a rare earth metal such as europium or ytterbium, an alloy containing such a rare earth metal, or the like can be used. However, when the electron-injection layer is provided between the cathode and the electron-transport layer, any of a variety of conductive materials such as aluminum, silver, ITO, ITO containing silicon or silicon oxide, and the like can be used regardless of its work function as the cathode. Films of these conductive materials can be formed by a sputtering method, an ink-jet method, a spin coating method, or the like.

For the second electrode 120, a stacked layer structure having a mixed film of a metal and an organic material (e.g., aluminum and NPB) and aluminum can be alternatively used. Such a structure can suppress an increase or expansion of dark spots.

It is preferable that, when the second electrode 120 is used as an anode, a metal, an alloy, a conductive compound, a mixture thereof, or the like having a high work function (greater than or equal to 4.0 eV, specifically) be used. Specifically, ITO, ITO containing silicon or silicon oxide, indium oxide-zinc oxide (IZO: indium zinc oxide), indium oxide containing tungsten oxide and zinc oxide (IWZO), and the like can be given. Such conductive metal oxide films are usually formed by sputtering, but may be formed by using a sol-gel method or the like. For example, an IZO film can be formed by a sputtering method using a target in which 1 wt % to 20 wt % of zinc oxide is added to indium oxide. An IWZO film can be formed by a sputtering method using a target in which 0.5 wt % to 5 wt % of tungsten oxide and 0.1 wt % to 1 wt % of zinc oxide are added to indium oxide. Other than these, gold, platinum, nickel, tungsten, chrome, molybdenum, iron, cobalt, copper, palladium, or a nitride of a metal material (for example, titanium nitride) or the like can be given. When the above-mentioned composite material is provided in contact with the anode, a material of the electrode can be selected regardless of its work function.

Figure 6A:
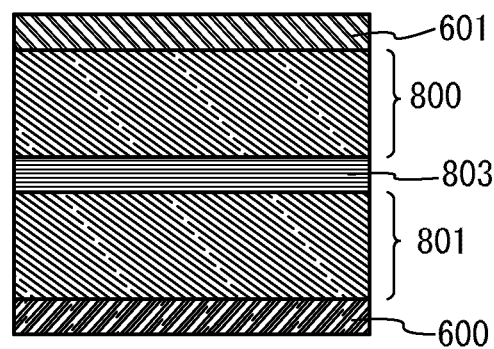
FIGS. 6A and 6B each illustrate a structure of a light-emitting element according to one embodiment.

Note that more than one of the above-mentioned EL layers may be formed between a first electrode 600 and a second electrode 601 as illustrated in FIG. 6A. In this case, a charge generation layer 803 is preferably provided between stacked EL layers 800 and 801. The charge generation layer 803 can be formed by using the above-mentioned composite material. Further, the charge generation layer 803 may have a stacked layer structure formed of a layer containing the composite material and a layer formed of another material. In this case, as the layer formed of another material, it is possible to use a layer containing a substance having an electron-donating property and a substance having a high electron-transport property, a layer formed of a conductive layer having a property of transmitting visible light, or the like. A light-emitting element having such a structure does not easily involve a problem such as energy transfer or quenching and has more choices of materials, thereby readily having both high light emission efficiency and a long lifetime. It is also easy for such a light-emitting element to exhibit phosphorescence from one of the EL layers and fluorescence from the other of the EL layers. This structure can be combined with any of the above-mentioned structures of the EL layer.

Figure 6B:
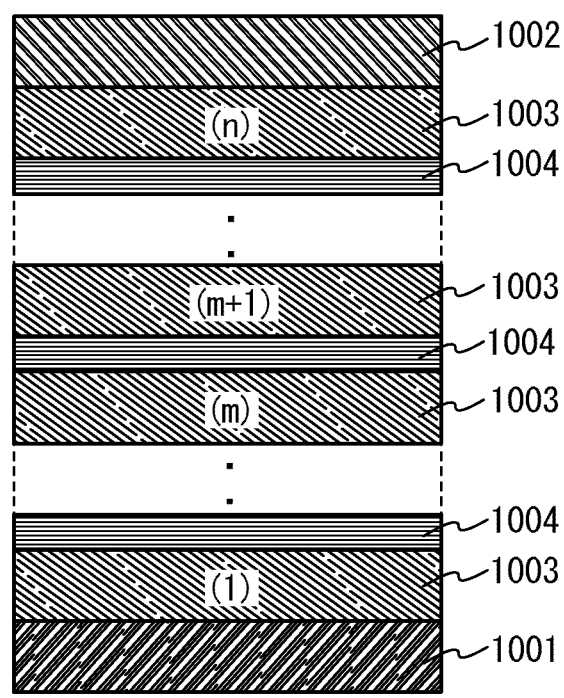

Next, the case where two or more EL layers are stacked between the first electrode and the second electrode will be described. As illustrated in FIG. 6B, in the case of a structure in which n (n is a natural number greater than or equal to 2) EL layers 1003 are stacked, a charge generation layer 1004 is provided between an m-th (m is a natural number greater than or equal to 1 and less than or equal to n−1) EL layer and an (m+1)-th EL layer.

The charge generation layer 1004 has a function of injecting holes to one of the EL layers 1003 which is formed in contact with the charge generation layer 1004 and a function of injecting electrons to another of the EL layers 1003 which is formed in contact with the charge generation layer 1004, when a voltage is applied to a first electrode 1001 and a second electrode 1002.

For the charge generation layer 1004, for example, a composite material of an organic compound and a metal oxide can be used. In addition, the charge generation layer 1004 can be formed by combining the composite material of an organic compound and a metal oxide with another material (such as an alkali metal, an alkaline earth metal, or a compound thereof). For example, a stacked layer structure including a layer formed of the composite material of an organic compound and a metal oxide and a layer formed of another material (such as an alkali metal, an alkaline earth metal, or a compound thereof) may be employed. As the composite material of an organic compound and a metal oxide, for example, an organic compound and a metal oxide such as $V_2O_5$, $MoO_3$, or $WO_3$ can be given. As the organic compound, various compounds such as an aromatic amine compound, a carbazole derivative, aromatic hydrocarbon, an oligomer, a dendrimer, and a polymer can be used. Note that an organic compound having a hole mobility of $10^{-6}$ cm$^2$/Vs or more is preferably used as the organic compound. Other than these substances, any substance that has a property of transporting more holes than electrons may be used. Since these materials used for the charge generation layer 1004 are excellent in carrier-injection property and carrier-transport property, low-current driving of the light-emitting element can be realized.

In particular, the structure illustrated in FIG. 6A is preferred in the case where white light is emitted, so that a light-emitting device having a long lifetime and high efficiency can be manufactured. For example, a full-color flexible light-emitting device can be manufactured by combining a flexible white light-emitting device used for a lighting apparatus with the structure in any of FIGS. 2A to 2D.

A combination of a plurality of light-emitting layers is a structure in which white light is emitted by including red light, blue light, and green light. One example is a structure including a first EL layer containing a blue fluorescent material as a light-emitting substance and a second EL layer containing red and green phosphorescent materials as light-emitting substances. Alternatively, white light can be emitted by a structure including light-emitting layers emitting light of complementary colors. In a stacked element including two stacked EL layers, when light emitted from the first EL layer and light emitted from the second EL layer have complementary colors, combinations of the complementary colors can be blue and yellow, blue-green and red, or the like. A substance emitting blue light, a substance emitting yellow light, a substance emitting blue-green light, and a substance emitting red light are each selected as appropriate from the light-emitting substances given above, for example.

An example of a structure having a plurality of light-emitting layers, in which colors of light from first and second EL layers are complementary colors and from which white light is obtained will be described.

For example, the first EL layer includes a first light-emitting layer which has an emission spectrum with a peak in the wavelength range of blue to blue-green, and includes a second light-emitting layer which has an emission spectrum with a peak in the wavelength range of yellow to orange. The second EL layer includes a third light-emitting layer which has an emission spectrum with a peak in the wavelength range of blue-green to green, and includes a fourth light-emitting layer which has an emission spectrum with a peak in the wavelength range of orange to red.

In this case, light emitted from the first EL layer is a combination of light emitted from both the first and second light-emitting layers and thus exhibits an emission spectrum having both a peak in the wavelength range of blue to blue-green and a peak in the wavelength range of yellow to orange. That is, the first EL layer emits light of two-wavelength white or a two-wavelength color close to white.

In addition, light emitted from the second EL layer is a combination of light emitted from both the third and fourth light-emitting layers and thus exhibits an emission spectrum having both a peak in the wavelength range of blue-green to green and a peak in the wavelength range of the range of orange to red. That is, the second EL layer emits light of two-wavelength white or a two-wavelength color close to white, which is different from the first EL layer.

Thus, a combination of light emitted from the first EL layer and light emitted from the second EL layer can provide emission of white which covers the wavelength ranges of blue to blue-green, blue-green to green, yellow to orange, and orange to red.

In the above-described structure of the stacked element, the charge generation layer between the stacked EL layers makes it possible to achieve light emission with high luminance with current density kept low, and thus a light-emitting element having a long lifetime can be realized. In addition, a voltage drop due to resistance of the electrode material can be reduced, whereby uniform light emission in a large area is possible.

Figure 3E:
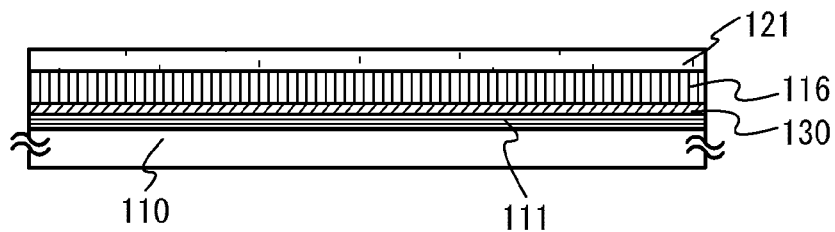

When the steps up to and including the formation of the second electrode 120 are finished, the sealing layer 121 is formed over the second electrode 120 (see FIG. 3E). A material that can be used for the sealing layer 121 is described above.

In the above manner, a light-emitting device according to one embodiment of the present invention as illustrated in FIGS. 1A and 1C can be manufactured.

A method for manufacturing a flexible light-emitting device including a transistor according to this embodiment, which is different from the above-mentioned manufacturing method, will be described with reference to FIGS. 7A to 7E and FIG. 1B. The manufacturing process described below has a lot in common (such as applicable materials) with that of the above-mentioned manufacturing process (see FIGS. 3A to 3E). Therefore, in the following description, description of the same points will be omitted and different points will be described in detail.

Figure 7A:
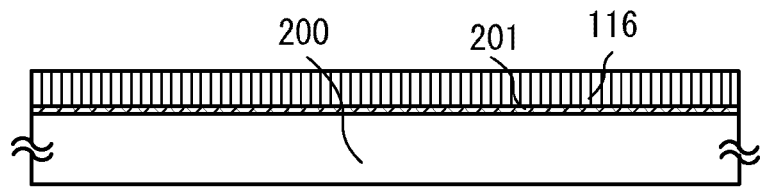
FIGS. 7A to 7E illustrate a manufacturing process of a light-emitting device according to one embodiment.
Figure 7B:
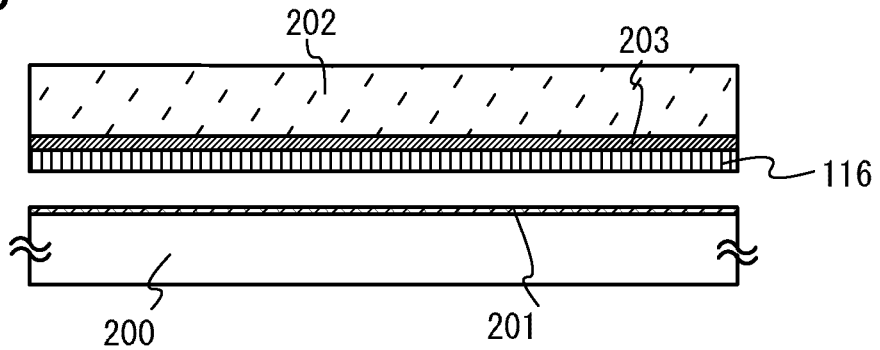

First, the layer 116 to be separated including a transistor, the first electrode 117, and the like is formed over the formation substrate 200 having an insulating surface, with the separation layer 201 provided therebetween (see FIG. 7A). In this case, the layer 116 to be separated includes the conductive layer 130 having a property of transmitting visible light.

In order to form the layer 116 to be separated, first, the protective layer 112 is formed over the separation layer 201. Next, the conductive layer 130 having a property of transmitting visible light is formed over the protective layer 112. Then, the base insulating layer 113 is formed over the conductive layer 130 having a property of transmitting visible light.

At this time, in order to manufacture the flexible light-emitting device with the structure illustrated in FIG. 1A, the following steps may be performed: the conductive layer 130 having a property of transmitting visible light is formed over the separation layer 201; the protective layer 112 is formed over the conductive layer 130 having a property of transmitting visible light; and the base insulating layer 113 is formed over the protective layer 112.

Then, a semiconductor layer, a gate insulating layer, a gate electrode layer, and the like are formed over the base insulating layer 113. Then, an interlayer insulating layer is formed. After that, the interlayer insulating layer is patterned and etched, whereby a contact hole which reaches the semiconductor layer of the transistor is formed in the interlayer insulating layer, the gate insulating layer, and the like. Then, a conductive metal film is deposited by a sputtering method or a vacuum evaporation method and etched to form a source electrode layer, a drain electrode layer, and a wiring of the transistor.

Next, a first electrode 117 is formed using a conductive layer having a property of transmitting visible light. The first electrode 117 which is a pixel electrode is formed so as to partly overlap with the drain electrode of the transistor for the pixel portion, whereby these electrodes are electrically connected to each other. After that, an insulating layer is formed using an organic insulating material or an inorganic insulating material so as to cover the interlayer insulating layer and the first electrode 117. The insulating layer is processed such that the surface of the first electrode 117 is exposed and the insulating layer covers an end portion of the first electrode 117, whereby the partition wall 118 is formed.

Through the above process, the layer 116 to be separated can be formed.

Next, the layer 116 to be separated and the temporary supporting substrate 202 are bonded to each other using an adhesive 203 for separation. The layer 116 to be separated is separated from the formation substrate 200 at the separation layer 201. By this process, the layer 116 to be separated is placed on the temporary supporting substrate 202 side (see FIG. 7B).

Figure 7C:
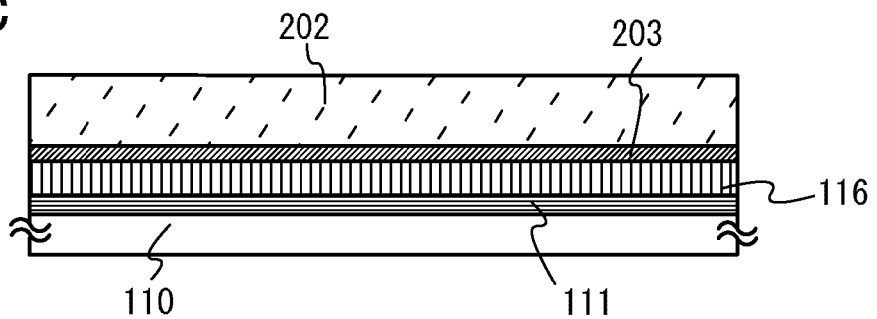
Figure 7D:
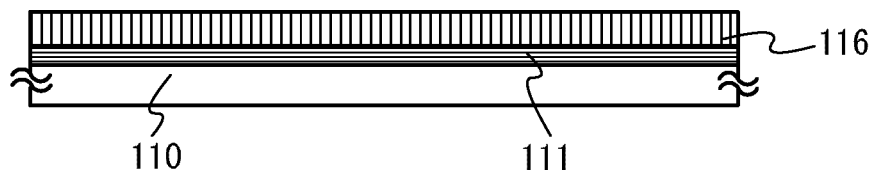
Figure 7E:
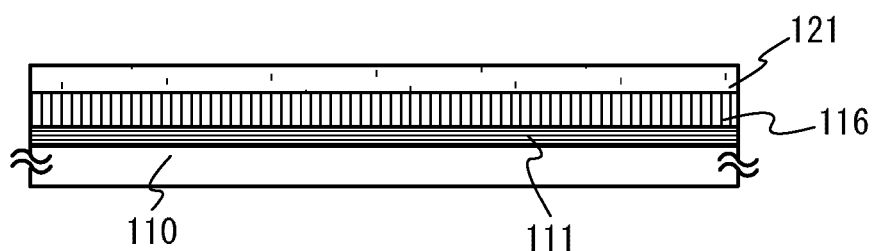

Next, the layer 116 to be separated which is separated from the formation substrate 200 to expose the separation layer 201 or the protective layer 112 (or the conductive layer 130 having a property of transmitting visible light) is bonded to the plastic substrate 110 using the first adhesive layer 111 which is formed of a different adhesive from the adhesive 203 for separation (see FIG. 7C).

After that, the temporary supporting substrate 202 is removed by dissolving or plasticizing the adhesive 203 for separation. After the temporary supporting substrate 202 is removed, the adhesive 203 for separation is removed using water, a solvent, or the like so as to expose the first electrode 117 of the light-emitting element (see FIG. 7D).

Through the above process, the layer 116 to be separated in which the transistor and up to the first electrode 117 of the light-emitting element are formed, can be manufactured over the plastic substrate 110.

After the first electrode 117 is exposed, the EL layer 119 is formed and the second electrode 120 is formed over the EL layer 119. The sealing layer 121 is formed over the second electrode 120 (see FIG. 7E).

In the above manner, a light-emitting device according to one embodiment of the present invention as illustrated in FIG. 1B can be manufactured.

This embodiment gives descriptions of the method of fabricating a flexible light-emitting device having a transistor in which the components up to the first electrode 117 of the light-emitting element are formed over the formation substrate and separation is performed, but the invention disclosed in this specification is not limited thereto. The separation and transfer may be performed after the components up to the light-emitting element 127 are formed (that is, after the second electrode 120 of the light-emitting element is formed). Alternatively, a transistor and a light-emitting element may be formed after only the protective layer 112 is formed over the formation substrate and the separation and the transfer to the plastic substrate 110 are performed.

Note that the coat layer 124 may be provided on the surface of the plastic substrate 110 which is opposite to the surface of the plastic substrate 110 which is provided with the light-emitting element and the like, as illustrated in FIG. 1C; thereby preventing scratches on the screen or breaking due to the pressure.

The plastic substrate 110 and the first adhesive layer 111 may each include a fibrous body therein. As the fibrous body, a high-strength fiber of an organic compound or an inorganic compound is used. The high-strength fiber specifically means a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, and the like can be given. As the plastic substrate 110, a structure body formed in the following manner may be employed: any of these fibers is used in a state of a woven fabric or a nonwoven fabric, this fibrous body is impregnated with an organic resin, and the organic resin is cured. It is preferable to use the structure body including a fibrous body and an organic resin as the plastic substrate 110, because such use improves reliability against bending or breaking caused by local pressure.

When the plastic substrate 110 or the first adhesive layer 111 includes the above-mentioned fibrous body, the fibrous body is preferably a nanofiber with a diameter of 100 nm or less in order to reduce the degree to which light emitted from a light-emitting element is prevented from being extracted outside. Further, refractive indexes of the fibrous body and the organic resin or the adhesive preferably match with each other.

The structure body, which is obtained in such a manner that the fibrous body is impregnated with an organic resin and the organic resin is cured, can also be used to serve as both the first adhesive layer 111 and the plastic substrate 110. At this time, as the organic resin for the structure body, it is preferable to use a reactive curable resin, a thermal curable resin, a UV curable resin, or the like which is better cured by additional treatment.

Then, an FPC (flexible printed circuit) is attached to each electrode of an input-output terminal portion with use of an anisotropic conductive member. An IC chip or the like may also be mounted if necessary.

Through the above process, a module type light-emitting device to which the FPC is connected is completed.

Figure 4A:
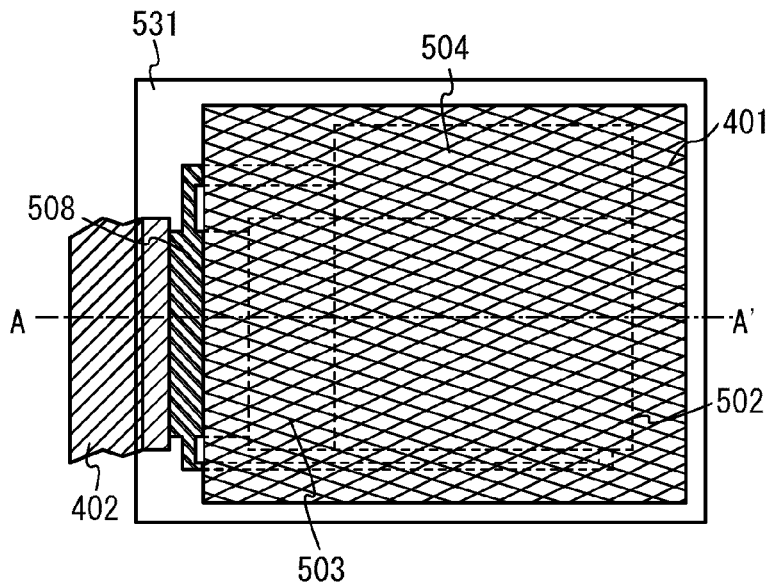
FIGS. 4A to 4C each illustrate a light-emitting device according to one embodiment.
Figure 4B:
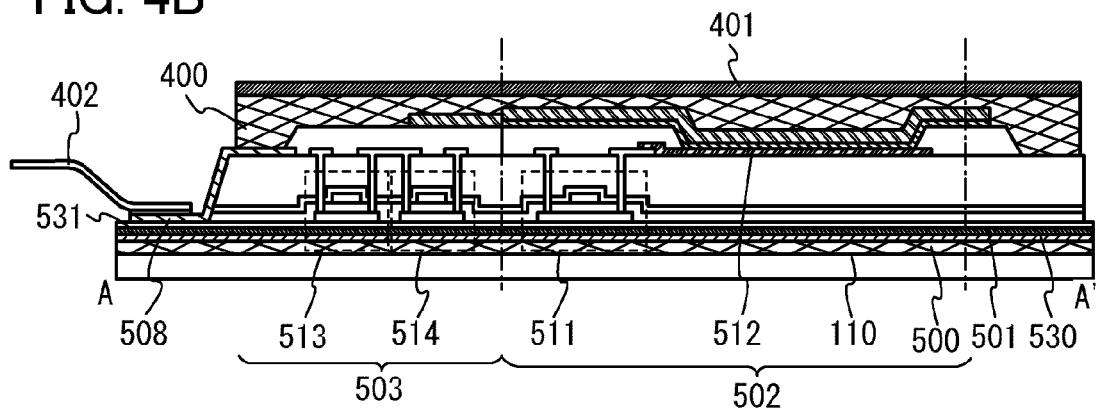
Figure 4C:
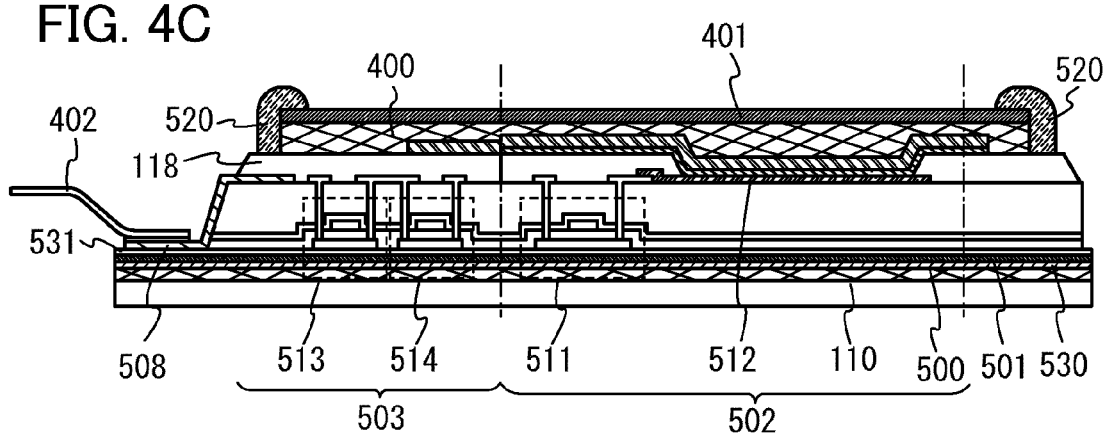

FIG. 4A is a top view of a module type light-emitting device (also referred to as an EL module), and FIGS. 4B and 4C are cross-sectional views thereof.

FIG. 4A is a top view illustrating an EL module, and FIG. 4B is a cross-sectional view along line A-A' of FIG. 4A. In FIG. 4A, a conductive layer 530 having a property of transmitting visible light is provided over the plastic substrate 110 with a first adhesive layer 500 interposed therebetween, and a protective layer 501 and a base insulating layer 531 are provided over the conductive layer 530 having a property of transmitting visible light. Over the base insulating layer 531, a pixel portion 502, a source side driver circuit 504, and a gate side driver circuit 503 are formed.

Further, a second adhesive layer 400 is formed over the pixel portion and the driver circuit portions, and a metal substrate 401 is bonded with use of the second adhesive layer 400, so that sealing is performed.

Note that a wiring 508 is a wiring for transmitting signals input to the source side driver circuit 504 and the gate side driver circuit 503, and receives video signals or clock signals from an FPC 402 which is an external input terminal. Although only the FPC 402 is illustrated here, this FPC may be provided with a printed wiring board (PWB). The flexible light-emitting device disclosed in this specification means not only the light-emitting device itself but also a device in which the FPC or the PWB is attached to the light-emitting device.

Next, a cross-sectional structure will be described with reference to FIG. 4B. The conductive layer 530 having a property of transmitting visible light is provided on and in contact with the first adhesive layer 500. The protective layer 501 and the base insulating layer 531 are provided over the conductive layer 530 having a property of transmitting visible light. The pixel portion 502 and the gate side deriver circuit 503 are formed over the base insulating layer 531. The pixel portion 502 is formed of a plurality of pixels each including a current control transistor 511 and a pixel electrode 512 electrically connected to a drain of the current control transistor 511. Further, the gate side driver circuit 503 is formed using a CMOS circuit that includes an n-channel transistor 513 and a p-channel transistor 514.

FIG. 4C illustrates an example of a cross-sectional structure which is different from FIG. 4B. In the example of FIG. 4C, a partition wall 118 is formed using an inorganic material such as silicon nitride, silicon oxynitride, silicon nitride oxide, or silicon oxide. The peripheral end portions of the second adhesive layer 400 and the metal substrate 401 are placed closer to the center of the flexible light-emitting device than the peripheral end portion of the partition wall 118. That is, the areas of the second adhesive layer 400 and the metal substrate 401 are smaller than the area of the partition wall 118, and the second adhesive layer 400 and the metal substrate 401 are placed over the partition wall 118 so as not to extend beyond the partition wall 118. Then, a low-melting point metal 520 is formed so as to cover the side surface of the second adhesive layer 400. With the low-melting point metal 520, moisture can be blocked highly effectively at the end portion on the side surface of the second adhesive layer 400, and thus, the lifetime of the flexible light-emitting device can be further improved. The low-melting point metal 520 is not limited to a particular metal, but a metal material which can be fused at approximately 45° C. to 300° C. is preferably used. When the fusion temperature is about 300° C., the temperature rises locally in the peripheral portion of the pixel portion and over the partition wall, and the low-melting point metal can be fused without damaging the light-emitting element or the plastic substrate. As such a material, a metal material containing tin, silver, copper, indium, or the like can be given. In addition, bismuth or the like may be further contained therein.

As described above, in the flexible light-emitting device described in this embodiment, a transistor can be formed over a formation substrate with high heat resistance and thus a transistor using a crystalline semiconductor such as crystalline silicon having high mobility can be formed. Accordingly, a driver circuit portion can be partially formed at the same time when a pixel portion is formed, whereby the flexible light-emitting device can be manufactured at lower cost.

As described above, the flexible light-emitting device according to this embodiment includes the conductive layer having a property of transmitting visible light between the first adhesive layer and a transistor, so that malfunction of transistors due to electrical charge of the organic resin (electrical charge caused by ionic impurities included in the organic resin or static electricity in the manufacturing process) can be suppressed. Accordingly, the flexible light-emitting device according to this embodiment can be a flexible light-emitting device with high yield, high reliability, and favorable display characteristics without display unevenness.

Embodiment 2

In this embodiment, an electronic device including the light-emitting device described in Embodiment 1 as a part thereof will be described.

Examples of the electronic device including the light-emitting device described in Embodiment 1 include cameras such as video cameras or digital cameras, goggle type displays, navigation systems, audio playback devices (e.g., car audio systems and audio systems), computers, game machines, portable information terminals (e.g., mobile computers, mobile phones, portable game machines, and electronic book devices), image playback devices in which a recording medium is provided (specifically, devices that are capable of playing back recording media such as digital versatile discs (DVDs) and equipped with a display unit that can display images), and the like. Such electronic devices are illustrated in FIGS. 5A to 5E.

Figure 5A:
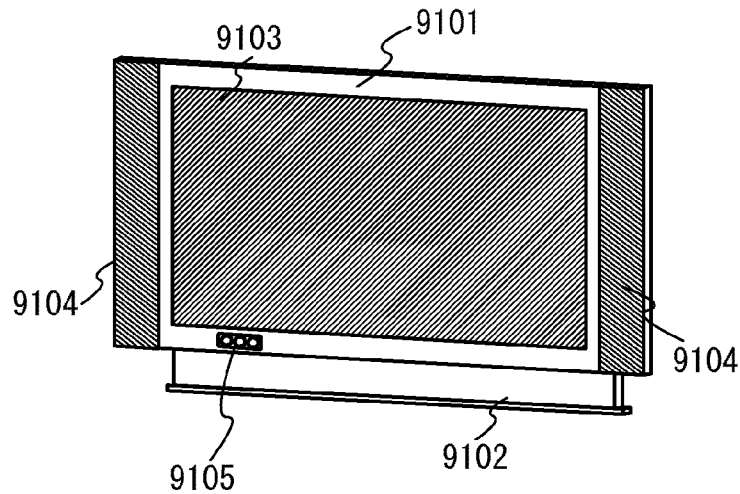
FIGS. 5A to 5E each illustrate an electronic device according to one embodiment.

FIG. 5A illustrates a television device which includes a housing 9101, a support 9102, a display portion 9103, speaker portions 9104, video input terminals 9105, and the like. In this television device, the display portion 9103 is manufactured using the light-emitting device described in Embodiment 1. The television device is provided with the light-emitting device described in Embodiment 1 which is flexible, has long lifetime, and can easily be manufactured. The display portion 9103 can perform display also when being curved and is lightweight, and thus, the television device can be a relatively inexpensive product with long lifetime.

Figure 5B:
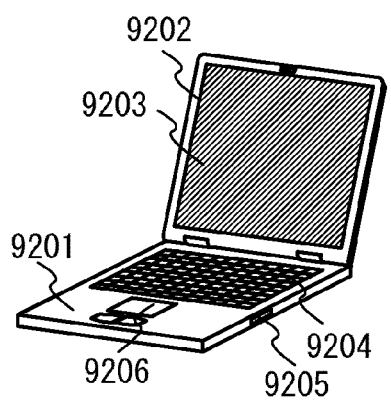

FIG. 5B illustrates a computer which includes a main body 9201, a housing 9202, a display portion 9203, a keyboard 9204, an external connection port 9205, a pointing device 9206, and the like. In this computer, the display portion 9203 is manufactured using the light-emitting device described in Embodiment 1. The computer is provided with the light-emitting device described in Embodiment 1 which is flexible, has long lifetime, and can easily be manufactured. The display portion 9203 can perform display also when being curved and is lightweight, and thus, the computer can be a relatively inexpensive product with long lifetime.

Figure 5C:
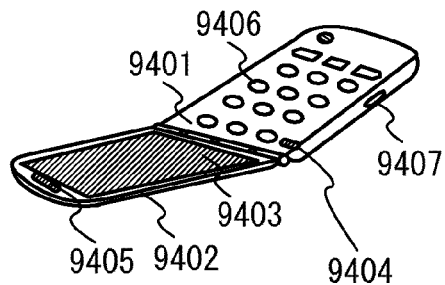

FIG. 5C illustrates a mobile phone which includes a main body 9401, a housing 9402, a display portion 9403, an audio input portion 9404, an audio output portion 9405, operation keys 9406, an external connection port 9407, and the like. In this mobile phone, the display portion 9403 is manufactured using the light-emitting device described in Embodiment 1. The mobile phone is provided with the light-emitting device described in Embodiment 1 which is flexible, has long lifetime, and can easily be manufactured. The display portion 9403 can perform display also when being curved and is lightweight and furthermore can provide images with high quality. The lightweight mobile phone of this embodiment can have appropriate weight for being carried even when a variety of additional values are added thereto, and thus the mobile phone is also suitable for use as a highly functional mobile phone.

Figure 5D:
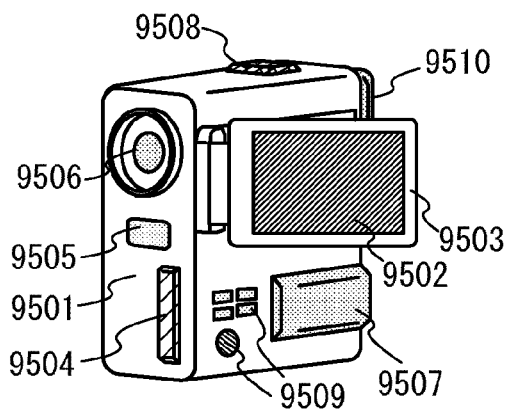

FIG. 5D illustrates a camera which includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. In this camera, the display portion 9502 is manufactured using the light-emitting device described in Embodiment 1. The camera is provided with the light-emitting device described in Embodiment 1 which is flexible, has long lifetime, and can easily be manufactured. The display portion 9502 can perform display also when being curved and is lightweight, and thus, the camera can be a relatively inexpensive product with long lifetime.

Figure 5E:
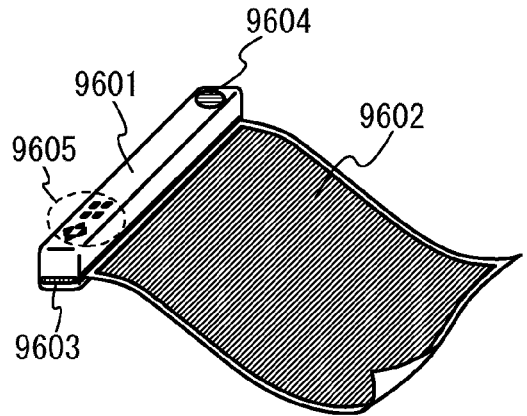

FIG. 5E illustrates a display which includes a main body 9601, a display portion 9602, an external memory insertion portion 9603, a speaker portion 9604, operation keys 9605, and the like. The main body 9601 may be provided with an antenna for receiving a television broadcast, an external input terminal, an external output terminal, a battery, and the like. In this display, the display portion 9602 is manufactured using the light-emitting device described in Embodiment 1. The flexible display portion 9602 can be rolled up and stored in the main body 9601 and is suitable for being carried. The display is provided with the light-emitting device described in Embodiment 1 which is flexible, has long lifetime, and can easily be manufactured. The display portion 9602 can be suitable for being carried and is lightweight, and thus, the display can be a relatively inexpensive product with long lifetime.

As described above, the application range of the light-emitting device described in Embodiment 1 is so wide that the light-emitting device can be applied to electronic devices of various fields.

This application is based on Japanese Patent Application serial no. 2010-010430 filed with Japan Patent Office on Jan. 20, 2010, the entire contents of which are hereby incorporated by reference.

What is claimed is:

1. A light-emitting device, comprising:
a substrate including an inorganic filler having a particle diameter of 40 nm or less;
an adhesive layer over the substrate;
an electrically conductive layer over the adhesive layer;
an insulating layer over the electrically conductive layer;
a first transistor over the insulating layer;
an interlayer insulating layer over the first transistor;
a light-emitting element over the interlayer insulating layer, wherein the light-emitting element comprises:
a first electrode electrically connected to a source or a drain of the first transistor;
a second electrode facing the first electrode; and
a layer including an organic compound having a light-emitting property provided between the first electrode and the second electrode; and
a sealing layer over the light-emitting element.

2. The light-emitting device according to claim 1, further comprising:
a pixel portion including the light-emitting element and the first transistor; and
a driver circuit portion outside the pixel portion, wherein the driver circuit portion includes a second transistor, wherein the first transistor and the second transistor are formed in a same process.

3. The light-emitting device according to claim 1, wherein an active layer of the first transistor comprises a crystalline silicon.

4. The light-emitting device according to claim 1, wherein an active layer of the first transistor comprises an oxide semiconductor.

5. The light-emitting device according to claim 1, wherein the sealing layer includes a metal substrate.

6. The light-emitting device according to claim 5, wherein the metal substrate comprises a material selected from stainless steel, aluminum, copper, nickel, and an aluminum alloy.

7. The light-emitting device according to claim 1, wherein the adhesive layer comprises at least one material selected from an epoxy resin, an acrylic resin, a silicone resin, and a phenol resin.

8. The light-emitting device according to claim 1 further comprising:
a layer configured to prevent a penetration of moisture between the substrate and the adhesive layer.

9. The light-emitting device according to claim 8, wherein the layer configured to prevent a penetration of moisture is a layer including silicon and nitrogen or a layer containing aluminum and nitrogen.

10. The light-emitting device according to claim 1, wherein the substrate includes a first surface facing the sealing layer, and includes a second surface, which is provided with a coat layer, being opposite to the first surface, and
wherein the substrate has flexibility.

11. The light-emitting device according to claim 10, wherein the coat layer has a property of transmitting visible light, and
wherein the coat layer is harder than the substrate.

12. The light-emitting device according to claim 10, wherein the coat layer is a conductive layer having a property of transmitting visible light.

13. The light-emitting device according to claim 1, wherein the insulating layer includes silicon and nitrogen.

14. The light-emitting device according to claim 1, wherein the electrically conductive layer has a property of transmitting visible light.

15. An electronic device comprising the light-emitting device according to claim 1 for a display portion.

16. The light-emitting device according to claim 1, wherein the electrically conductive layer comprises any one of indium oxide, tin oxide, ITO, oxide of indium containing tungsten oxide, indium zinc oxide containing tungsten oxide, indium oxide containing titanium oxide, indium zinc oxide, indium tin oxide to which silicon oxide is added, and antimony oxide.

17. A light-emitting device, comprising:
a substrate including an inorganic filler having a particle diameter of 40 nm or less;
an adhesive layer over the substrate;
a first insulating layer over the adhesive layer;
an electrically conductive layer over the first insulating layer;
a second insulating layer over the electrically conductive layer;
a first transistor over the second insulating layer;
an interlayer insulating layer over the first transistor;
a light-emitting element over the interlayer insulating layer, wherein the light-emitting element comprises:
a first electrode electrically connected to a source or a drain of the first transistor;
a second electrode facing the first electrode; and a layer including an organic compound having a light-emitting property provided between the first electrode and the second electrode; and a sealing layer over the light-emitting element.

18. The light-emitting device according to claim 17, further comprising:
a pixel portion including the light-emitting element and the first transistor; and
a driver circuit portion outside the pixel portion, wherein the driver circuit portion includes a second transistor,
wherein the first transistor and the second transistor are formed in a same process.

19. The light-emitting device according to claim 17,
wherein an active layer of the first transistor comprises a crystalline silicon.

20. The light-emitting device according to claim 17,
wherein an active layer of the first transistor comprises an oxide semiconductor.

21. The light-emitting device according to claim 17,
wherein the sealing layer includes a metal substrate.

22. The light-emitting device according to claim 21,
wherein the metal substrate comprises a material selected from stainless steel, aluminum, copper, nickel, and an aluminum alloy.

23. The light-emitting device according to claim 17,
wherein the adhesive layer comprises at least one material selected from an epoxy resin, an acrylic resin, a silicone resin, and a phenol resin.

24. The light-emitting device according to claim 17 further comprising:
a layer configured to prevent a penetration of moisture between the substrate and the adhesive layer.

25. The light-emitting device according to claim 24,
wherein the layer configured to prevent a penetration of moisture is a layer including silicon and nitrogen or a layer containing aluminum and nitrogen.

26. The light-emitting device according to claim 17,
wherein the substrate includes a first surface facing the sealing layer, and includes a second surface, which is provided with a coat layer, being opposite to the first surface, and
wherein the substrate has flexibility.

27. The light-emitting device according to claim 26,
wherein the coat layer has a property of transmitting visible light, and
wherein the coat layer is harder than the substrate.

28. The light-emitting device according to claim 26,
wherein the coat layer is a conductive layer having a property of transmitting visible light.

29. The light-emitting device according to claim 17,
wherein the first insulating layer includes silicon and nitrogen.

30. The light-emitting device according to claim 17,
wherein the electrically conductive layer has a property of transmitting visible light.

31. An electronic device comprising the light-emitting device according to claim 17 for a display portion.

32. The light-emitting device according to claim 17,
wherein the electrically conductive layer comprises any one of indium oxide, tin oxide, ITO, oxide of indium containing tungsten oxide, indium zinc oxide containing tungsten oxide, indium oxide containing titanium oxide, indium zinc oxide, indium tin oxide to which silicon oxide is added, and antimony oxide.

33. A light-emitting device, comprising:
a substrate including an inorganic filler having a particle diameter of 40 nm or less;
an adhesive layer over the substrate;
an electrically conductive layer over the adhesive layer;
an insulating layer over the electrically conductive layer;
a light-emitting element over the insulating layer, wherein the light-emitting element comprises:
a first electrode;
a second electrode facing the first electrode; and
a layer including an organic compound having a light-emitting property provided between the first electrode and the second electrode; and
a sealing layer over the light-emitting element.

34. The light-emitting device according to claim 33,
wherein the sealing layer includes a metal substrate.

35. The light-emitting device according to claim 33,
wherein the adhesive layer comprises at least one material selected from an epoxy resin, an acrylic resin, a silicone resin, and a phenol resin.

36. The light-emitting device according to claim 33 further comprising:
a layer including silicon and nitrogen or a layer containing aluminum and nitrogen between the substrate and the adhesive layer.

37. The light-emitting device according to claim 33,
wherein the substrate includes a first surface facing the sealing layer, and includes a second surface, which is provided with a second electrically conductive layer having a property of transmitting visible light, being opposite to the first surface,
wherein the substrate has flexibility, and
wherein the second electrically conductive layer is harder than the substrate.

38. The light-emitting device according to claim 33,
wherein the insulating layer includes silicon and nitrogen.

39. An electronic device comprising the light-emitting device according to claim 33 for a display portion.

40. The light-emitting device according to claim 33,
wherein the electrically conductive layer comprises any one of indium oxide, tin oxide, ITO, oxide of indium containing tungsten oxide, indium zinc oxide containing tungsten oxide, indium oxide containing titanium oxide, indium zinc oxide, indium tin oxide to which silicon oxide is added, and antimony oxide.

* * * * *